United States Patent
Ghosh et al.

(10) Patent No.: US 9,229,144 B2
(45) Date of Patent: Jan. 5, 2016

(54) REDIRECTING OPTICS FOR CONCENTRATION AND ILLUMINATION SYSTEMS

(71) Applicant: Banyan Energy, Inc., Berkeley, CA (US)

(72) Inventors: Shondip Ghosh, Berkeley, CA (US); David Sheldon Schultz, Berkeley, CA (US)

(73) Assignee: BANYAN ENERGY INC., Berkeley, CA (US)

( * ) Notice: Subject to any disclaimer, the term of this patent is extended or adjusted under 35 U.S.C. 154(b) by 0 days.

(21) Appl. No.: 14/230,989

(22) Filed: Mar. 31, 2014

(65) Prior Publication Data
US 2014/0268809 A1    Sep. 18, 2014

Related U.S. Application Data

(63) Continuation of application No. 13/282,147, filed on Oct. 26, 2011, now Pat. No. 8,705,914, and a continuation-in-part of application No. 12/939,348, filed on Nov. 4, 2010, now Pat. No. 8,412,010, which
(Continued)

(51) Int. Cl.
| | |
|---|---|
| *F21V 7/00* | (2006.01) |
| *F21V 8/00* | (2006.01) |
| *F24J 2/06* | (2006.01) |
| *F24J 2/08* | (2006.01) |

(Continued)

(52) U.S. Cl.
CPC .............. *G02B 6/0001* (2013.01); *F24J 2/06* (2013.01); *F24J 2/067* (2013.01); *F24J 2/08* (2013.01); *F24J 2/18* (2013.01); *H01L 31/0547* (2014.12); *G02B 6/0018* (2013.01); *G02B 6/0028* (2013.01); *G02B 6/0048* (2013.01); *G02B 6/4214* (2013.01); *G02B 6/4298* (2013.01); *Y02E 10/44* (2013.01); *Y02E 10/52* (2013.01)

(58) Field of Classification Search
CPC ......... G02B 6/4214; G02B 6/262; F21S 8/06; F21V 17/00
USPC ........ 362/307, 296.01; 385/31; 359/868, 853, 359/838
See application file for complete search history.

(56) References Cited

U.S. PATENT DOCUMENTS

| | | | |
|---|---|---|---|
| 705,778 | A | 7/1902 | McCabe |
| 3,780,722 | A | 12/1973 | Swet |

(Continued)

FOREIGN PATENT DOCUMENTS

| | | |
|---|---|---|
| CA | 2 685 103 | 11/2008 |
| CA | 2658193 | 9/2010 |

(Continued)

OTHER PUBLICATIONS

U.S. Appl. No. 60/942,745, filed Jun. 8, 2007, Morgan.
(Continued)

*Primary Examiner* — Ellen Kim
(74) *Attorney, Agent, or Firm* — Foley & Lardner LLP

(57) ABSTRACT

An optical system having an optical waveguide for outputting light, a receiver for receiving the light, and redirecting optics for outputting the light from the optical waveguide. The optical system can be used for light illumination. The optical system can further be used for diffusing light in illumination applications by replacing the receiver with a light source such that the light flows in the reverse of the concentration system.

18 Claims, 51 Drawing Sheets

Related U.S. Application Data is a continuation of application No. 12/705,434, filed on Feb. 12, 2010, now Pat. No. 7,925,129, which is a continuation-in-part of application No. 12/207,346, filed on Sep. 9, 2008, now Pat. No. 7,664,350, which is a continuation-in-part of application No. 11/852,854, filed on Sep. 10, 2007, now Pat. No. 7,672,549.

(60) Provisional application No. 61/407,772, filed on Oct. 28, 2010.

(51) Int. Cl.
  *F24J 2/18* (2006.01)
  *H01L 31/054* (2014.01)
  *G02B 6/42* (2006.01)

(56) References Cited

U.S. PATENT DOCUMENTS

| | | |
|---|---|---|
| 4,029,519 A | 6/1977 | Schertz et al. |
| 4,344,417 A | 8/1982 | Malecek |
| 4,357,486 A | 11/1982 | Blieden et al. |
| 4,379,944 A | 4/1983 | Borden et al. |
| 4,411,490 A | 10/1983 | Daniel |
| 4,505,264 A | 3/1985 | Tremblay |
| 4,863,224 A | 9/1989 | Afian et al. |
| 5,050,946 A | 9/1991 | Hathaway et al. |
| 5,146,354 A | 9/1992 | Plesinger |
| 5,150,960 A | 9/1992 | Redick |
| 5,237,641 A | 8/1993 | Jacobson et al. |
| 5,253,089 A | 10/1993 | Imai |
| 5,303,322 A | 4/1994 | Winston et al. |
| 5,323,477 A | 6/1994 | Lebby et al. |
| 5,339,179 A | 8/1994 | Rudisill et al. |
| 5,341,231 A | 8/1994 | Yamamoto et al. |
| 5,353,075 A | 10/1994 | Conner et al. |
| 5,359,691 A | 10/1994 | Tai et al. |
| 5,386,090 A | 1/1995 | Hofmann |
| 5,390,085 A | 2/1995 | Mari-Roca et al. |
| 5,390,276 A | 2/1995 | Tai et al. |
| 5,392,199 A | 2/1995 | Kashima et al. |
| 5,396,350 A | 3/1995 | Beeson et al. |
| 5,400,224 A | 3/1995 | DuNah et al. |
| 5,408,388 A | 4/1995 | Kobayashi et al. |
| 5,410,454 A | 4/1995 | Murase et al. |
| 5,418,384 A | 5/1995 | Yamana et al. |
| 5,420,761 A | 5/1995 | DuNah et al. |
| 5,428,468 A | 6/1995 | Zimmerman et al. |
| 5,432,876 A | 7/1995 | Appeldorn et al. |
| 5,438,484 A | 8/1995 | Kanda et al. |
| 5,440,197 A | 8/1995 | Gleckman |
| 5,455,882 A | 10/1995 | Veligdan |
| 5,467,417 A | 11/1995 | Nakamura et al. |
| 5,477,239 A | 12/1995 | Busch et al. |
| 5,479,275 A | 12/1995 | Abileah |
| 5,485,291 A | 1/1996 | Qiao et al. |
| 5,485,354 A | 1/1996 | Ciupke et al. |
| 5,499,165 A | 3/1996 | Holmes, Jr. |
| 5,506,929 A | 4/1996 | Tai et al. |
| 5,521,725 A * | 5/1996 | Beeson et al. .................. 349/95 |
| 5,528,709 A | 6/1996 | Koike et al. |
| 5,528,720 A | 6/1996 | Winston et al. |
| 5,542,017 A | 7/1996 | Koike |
| 5,555,329 A | 9/1996 | Kuper et al. |
| 5,579,134 A | 11/1996 | Lengyel |
| 5,580,932 A | 12/1996 | Koike |
| 5,581,683 A | 12/1996 | Bertignoll et al. |
| 5,594,830 A | 1/1997 | Winston et al. |
| 5,598,281 A | 1/1997 | Zimmerman et al. |
| 5,608,837 A | 3/1997 | Tai et al. |
| 5,621,833 A | 4/1997 | Lau et al. |
| 5,627,926 A | 5/1997 | Nakamura et al. |
| 5,631,994 A | 5/1997 | Appeldorn et al. |
| 5,640,483 A | 6/1997 | Lin |
| 5,647,655 A | 7/1997 | Kashima et al. |
| 5,648,858 A | 7/1997 | Shibata et al. |
| 5,659,643 A | 8/1997 | Appeldorn et al. |
| 5,664,862 A | 9/1997 | Redmond et al. |
| 5,664,873 A | 9/1997 | Kanda et al. |
| 5,667,762 A | 9/1997 | Fukushima et al. |
| 5,668,913 A | 9/1997 | Tai et al. |
| 5,671,994 A | 9/1997 | Tai et al. |
| 5,673,128 A | 9/1997 | Ohta et al. |
| 5,684,354 A | 11/1997 | Gleckman |
| 5,692,066 A | 11/1997 | Lee et al. |
| 5,704,703 A | 1/1998 | Yamada et al. |
| 5,710,793 A | 1/1998 | Greenberg |
| 5,806,955 A | 9/1998 | Parkyn, Jr. et al. |
| 5,828,427 A | 10/1998 | Faris |
| 5,835,661 A | 11/1998 | Tai et al. |
| 5,838,403 A | 11/1998 | Jannson et al. |
| 5,854,872 A | 12/1998 | Tai |
| 5,870,156 A | 2/1999 | Heembrock |
| 5,877,874 A | 3/1999 | Rosenberg |
| 5,892,325 A | 4/1999 | Gleckman |
| 5,905,583 A | 5/1999 | Kawai et al. |
| 5,905,826 A | 5/1999 | Benson, Jr. et al. |
| 5,914,760 A | 6/1999 | Daiku |
| 5,926,601 A | 7/1999 | Tai et al. |
| 5,977,478 A | 11/1999 | Hibino et al. |
| 5,982,540 A | 11/1999 | Koike et al. |
| 5,993,020 A | 11/1999 | Koike |
| 6,002,829 A | 12/1999 | Winston et al. |
| 6,005,343 A | 12/1999 | Rakhimov et al. |
| 6,007,209 A | 12/1999 | Pelka |
| 6,021,007 A | 2/2000 | Murtha |
| 6,043,591 A | 3/2000 | Gleckman |
| 6,072,551 A | 6/2000 | Jannson et al. |
| 6,104,447 A | 8/2000 | Faris |
| 6,108,059 A | 8/2000 | Yang |
| 6,111,622 A | 8/2000 | Abileah |
| 6,123,431 A | 9/2000 | Teragaki et al. |
| 6,129,439 A | 10/2000 | Hou et al. |
| 6,134,092 A | 10/2000 | Pelka et al. |
| 6,151,089 A | 11/2000 | Yang et al. |
| 6,164,799 A | 12/2000 | Hirmer et al. |
| 6,172,809 B1 | 1/2001 | Koike et al. |
| 6,222,598 B1 | 4/2001 | Hiyama et al. |
| 6,234,656 B1 | 5/2001 | Hosseini et al. |
| 6,252,155 B1 | 6/2001 | Ortabasi |
| 6,266,108 B1 | 7/2001 | Bao et al. |
| 6,313,892 B2 | 11/2001 | Gleckman |
| 6,335,999 B1 | 1/2002 | Winston et al. |
| 6,347,874 B1 | 2/2002 | Boyd et al. |
| 6,351,594 B1 | 2/2002 | Nakamura et al. |
| 6,379,016 B1 | 4/2002 | Boyd et al. |
| 6,409,356 B1 | 6/2002 | Nishimura |
| 6,428,198 B1 | 8/2002 | Saccomanno et al. |
| 6,440,769 B2 | 8/2002 | Peumans et al. |
| 6,473,554 B1 | 10/2002 | Pelka et al. |
| 6,476,312 B1 | 11/2002 | Barnham |
| 6,496,237 B1 | 12/2002 | Gleckman |
| 6,497,939 B1 | 12/2002 | Obuchi et al. |
| 6,512,600 B1 | 1/2003 | Kawai et al. |
| 6,576,887 B2 | 6/2003 | Whitney et al. |
| 6,592,234 B2 | 7/2003 | Epstein et al. |
| 6,612,709 B2 | 9/2003 | Yamada et al. |
| 6,623,132 B2 | 9/2003 | Lekson et al. |
| 6,639,349 B1 | 10/2003 | Bahadur |
| 6,644,823 B2 | 11/2003 | Egawa et al. |
| 6,647,199 B1 | 11/2003 | Pelka et al. |
| 6,671,452 B2 * | 12/2003 | Winston et al. ............... 385/146 |
| 6,730,840 B2 | 5/2004 | Sasaoka et al. |
| 6,738,051 B2 | 5/2004 | Boyd et al. |
| 6,752,504 B2 | 6/2004 | Lee et al. |
| 6,755,545 B2 | 6/2004 | Lee |
| 6,796,700 B2 | 9/2004 | Kraft |
| 6,828,007 B2 | 12/2004 | Obuchi et al. |
| 6,842,571 B2 | 1/2005 | Kramer et al. |
| 6,851,815 B2 | 2/2005 | Lee |
| 6,879,354 B1 | 4/2005 | Sawayama et al. |
| 6,948,838 B2 | 9/2005 | Kunstler |
| 6,957,904 B2 | 10/2005 | Randall |
| 6,966,661 B2 | 11/2005 | Read |

(56) References Cited

U.S. PATENT DOCUMENTS

| | | |
|---|---|---|
| 6,966,684 B2 | 11/2005 | Sommers et al. |
| 6,976,778 B2 | 12/2005 | Kamijima |
| 6,976,779 B2 | 12/2005 | Ohtsuki et al. |
| 6,986,660 B2 | 1/2006 | Kumar et al. |
| 6,992,733 B1 | 1/2006 | Klein |
| 6,993,242 B2 | 1/2006 | Winston et al. |
| 7,018,085 B2 | 3/2006 | Lee et al. |
| 7,046,907 B2 | 5/2006 | Miyashita |
| 7,063,449 B2 | 6/2006 | Ward |
| 7,286,296 B2 | 10/2007 | Chaves et al. |
| 7,664,350 B2 | 2/2010 | Ghosh et al. |
| 7,672,549 B2 | 3/2010 | Ghosh et al. |
| 7,873,257 B2 | 1/2011 | Morgan |
| 7,878,190 B2 | 2/2011 | Charlton et al. |
| 7,925,129 B2 | 4/2011 | Ghosh et al. |
| 7,992,361 B2 | 8/2011 | Brett |
| 2005/0243570 A1 | 11/2005 | Chaves et al. |
| 2006/0174867 A1 | 8/2006 | Schaafsma |
| 2008/0202500 A1 | 8/2008 | Hodges |
| 2008/0271776 A1 | 11/2008 | Morgan |
| 2009/0064993 A1 | 3/2009 | Ghosh et al. |
| 2009/0067784 A1 | 3/2009 | Ghosh et al. |
| 2009/0110356 A1 | 4/2009 | Xiang et al. |
| 2009/0133686 A1 | 5/2009 | Charlton et al. |
| 2010/0116319 A1 | 5/2010 | Martinez Anton et al. |
| 2010/0278480 A1 | 11/2010 | Vasylyev |

FOREIGN PATENT DOCUMENTS

| | | |
|---|---|---|
| CN | 101809377 | 8/2010 |
| CN | 102027183 | 4/2011 |
| CN | 102177591 | 9/2011 |
| CN | 102396081 | 3/2012 |
| CN | 101681949 | 3/2013 |
| EP | 2153475 | 7/2010 |
| EP | 2286051 | 2/2011 |
| EP | 2351107 | 8/2011 |
| EP | 2406831 | 6/2012 |
| EP | 2460187 | 6/2012 |
| JP | 10-012025 | 10/1998 |
| JP | 10-298605 | 10/1998 |
| JP | 2001-127331 A | 5/2001 |
| JP | 2003-234484 A | 8/2003 |
| JP | 2004 04773 A | 2/2004 |
| JP | 2010-525582 | 7/2010 |
| KR | 1020010022006 A | 3/2001 |
| WO | WO 99/04296 | 1/1999 |
| WO | WO 2004/114418 | 12/2004 |
| WO | WO 2006/064365 A2 | 6/2006 |
| WO | WO 2006/085339 A2 | 8/2006 |
| WO | WO2008/131561 | 11/2008 |
| WO | WO-2009/035986 | 3/2009 |
| WO | WO-2009/063416 | 5/2009 |
| WO | WO2009/121180 | 10/2009 |
| WO | WO2010/025550 | 3/2010 |
| WO | WO-2010/027944 A2 | 3/2010 |
| WO | WO-2010/033859 | 3/2010 |
| WO | WO2010/102408 | 9/2010 |
| WO | WO2011/011885 | 3/2011 |
| WO | WO 2011/153633 | 12/2011 |
| WO | WO 2011/114240 | 2/2012 |

OTHER PUBLICATIONS

U.S. Appl. No. 60/915,207, filed May 1, 2007, Morgan.
Notice of Allowance for U.S. Appl. No. 12/705,434, dated Feb. 23, 2011, 8 pages.
Office Action for U.S. Appl. No. 11/852,854, dated Aug. 21, 2009, 6 pages.
Office Action for U.S. Appl. No. 12/207,346 dated Apr. 24, 2009, 6 pages.
Notice of Allowance for U.S. Appl. No. 11/852,854 dated Dec. 29, 2009, 8 pages.
Notice of Allowance for U.S. Appl. No. 12/207,346, dated Dec. 22, 2009, 7 pages.
Office Action for U.S. Appl. No. 12/705,434 dated Sep. 2, 2010, 6 pages.
Office Action for U.S. Appl. No. 12/705,434 dated Dec. 28, 2010, 7 pages.
Office Action for U.S. Appl. No. 12/939,348, dated Oct. 16, 2012, 9 pages.
Notice of Allowance for U.S. Appl. No. 12/939,348, dated Dec. 7, 2012, 8 pages.
Office Action for U.S. Appl. No. 13/282,147, dated Jun. 12, 2013, 6 pages.
Notice of Allowance for U.S. Appl. No. 13/282,147, dated Nov. 7, 2013, 10 pages.
Second Notification of Provisional Rejection for Korean App. No. 10-2010-7007127, dated Nov. 27, 2013, 4 pages.
Office Action for Canada App. No. 2,816,065, dated Nov. 4, 2014, 9 pages.
Office Action for Canada App. No. 2,698,284, dated May 31, 2011, 3 pages.
Notification of the Second Office Action for Chinese App. No. 200880105784.7, dated Feb. 22, 2012, 4 pages.
Office Action for European App. 08830932.3-1528, dated Oct. 10, 2011, 7 pages.
Extended Search Report for EP 11837013.9-1605, dated Oct. 10, 2014, 8 pages.
International Search Report for PCT/US2008/075737, Dated Mar. 30, 2009, 3 pages.
Office Action for Japanese App. No. 2010-524238, dated Jan. 7, 2013, 22 pages.
U.S. Appl. No. 60/951,775, filed Jul. 25, 2007, Morgan.
U.S. Appl. No. 61/041,756, filed Apr. 2, 2008, Morgan.
U.S. Appl. No. 61/094,168, filed Sep. 4, 2008, Morgan.
U.S. Appl. No. 61/145,321, filed Jan. 16, 2009, Morgan.
U.S. Appl. No. 12/417,424, filed Apr. 2, 2009, Morgan.
U.S. Appl. No. 61/229,542, filed Jul. 29, 2009, Morgan.
U.S. Appl. No. 12/554,481, filed Sep. 4, 2009, Morgan.
U.S. Appl. No. 12/705,415, filed Feb. 12, 2010, Morgan.
U.S. Appl. No. 13/063,847, filed Jun. 1, 2011, Morgan.
U.S. Appl. No. 61/315,744, filed Mar. 19, 2010, Morgan.
U.S. Appl. No. 13/028,957, filed Feb. 16, 2011, Morgan.
U.S. Appl. No. 13/053,184, filed Mar. 21, 2011, Morgan.
U.S. Appl. No. 13/078,724, filed Apr. 1, 2011, Morgan.
U.S. Appl. No. 61/320,149, filed Apr. 1, 2010, Morgan.
U.S. Appl. No. 13/703,281, filed Dec. 10, 2012, Morgan.
U.S. Appl. No. 13/195,537, filed Aug. 1, 2011, Morgan.
U.S. Appl. No. 13/366,760, filed Feb. 6, 2012, Morgan.
U.S. Appl. No. 13/425,811, filed Mar. 21, 2012, Morgan.
U.S. Appl. No. 13/873,521, filed Apr. 30, 2013, Morgan.
U.S. Appl. No. 13/892,821, filed May 13, 2013, Morgan.
Communication and Extended Search Report for EP 11837013.9, dated Oct. 10, 2014, 8 pages.
Morgan Substantive Motion 1, Patent and Trial Appeal Board, *Morgan Solar Inc.* v. *Banyan Energy, Inc.*, Patent Inteference No. 105972, dated Mar. 25, 2014.
Banyan Opposition 1 (to Morgan's Motion for Benefit), Patent and Trial Appeal Board, *Morgan Solar Inc.* v. *Banyan Energy, Inc.*, Patent Inteference No. 105972, dated May 20, 2014.
Banyan Opposition 2 (to Morgan's Written Description Motion), Patent and Trial Appeal Board, *Morgan Solar Inc.* v. *Banyan Energy, Inc.*, Patent Inteference No. 105972, dated May 20, 2014.
Morgan Reply 1, Patent and Trial Appeal Board, *Morgan Solar Inc.* v. *Banyan Energy, Inc.*, Patent Inteference No. 105972, dated Jul. 2, 2014.
Morgan Reply 2, Patent and Trial Appeal Board, *Morgan Solar Inc.* v. *Banyan Energy, Inc.*, Patent Inteference No. 105972, dated Jul. 2, 2014.
First Declaration of Dr. Zane Coleman, Patent and Trial Appeal Board, *Morgan Solar Inc.* v. *Banyan Energy, Inc.*, Patent Inteference No. 105972, dated May 20, 2014.
Office Action for Canadian App. No. 2,815,671 dated Aug. 18, 2014, 7 pages.

(56) References Cited

OTHER PUBLICATIONS

PCT International Search Report, PCT/US2011/058114, dated May 30, 2012, 3 pages.
Chaves et al., "Ultra Flat Ideal Concentrators of High Concentration", *Solar Energy*, 2000, pp. 269-281, vol. 69, No. 4, *Elsevier Science Ltd.*, Great Britain.
Chaves et al., "Ideal Concentrators with Gaps", *Applied Optics*, Mar. 1, 2002, pp. 1267-1276, vol. 41, No. 7, *Optical Society of America*, USA.
Ghosh et al., "A New Approach to Concentrating and Aggregating Light Energy," Jun. 2007.
Office Action dated Oct. 16, 2012, U.S. Appl. No. 12/939,348, 16 pages.
Morgan Substantive Motion 2, Patent and Trial Appeal Board, *Morgan Solar Inc.*, v. *Banyan Energy, Inc.*, Patent Interference 105,972, dated Mar. 25, 2014.
Declaration of Interference, Patent and Trial Appeal Board, *Morgan Solar Inc.*, v. *Banyan Energy, Inc.*, Patent Interference 105,972, dated Nov. 1, 2013.
Office Action for Canadian App. 2,816,065, dated Nov. 4, 2014, 11 pages.
Office Action for Japanese App. No. 2010-524238, dated Jan. 22, 2015, 4 pages.
Office Action for Canada App. No. 2,816,065, dated Apr. 1, 2015, 9 pages.
English Translation of Chinese Office Action for Application No. 201180053145.2, dated Jun. 18, 2015, 10 pages.
European Examination Report for Application No. 08830932.3, Dated Jul. 3, 2015, 6 pages.
Office Action for Canadian App. No. 2,816,065, dated Jun. 17, 2015, 3 pages.
Japanese Office Action for Application No. 2013-536777 with English translation, dated Sep. 2, 2015, 5 pages.
Japanese Office Action for Application No. 2013-537705 with English translation, dated Sep. 2, 2015, 5 pages.
Canadian Office Action for Application No. 2,815,671, dated Oct. 26, 2015, 7 pages.

\* cited by examiner

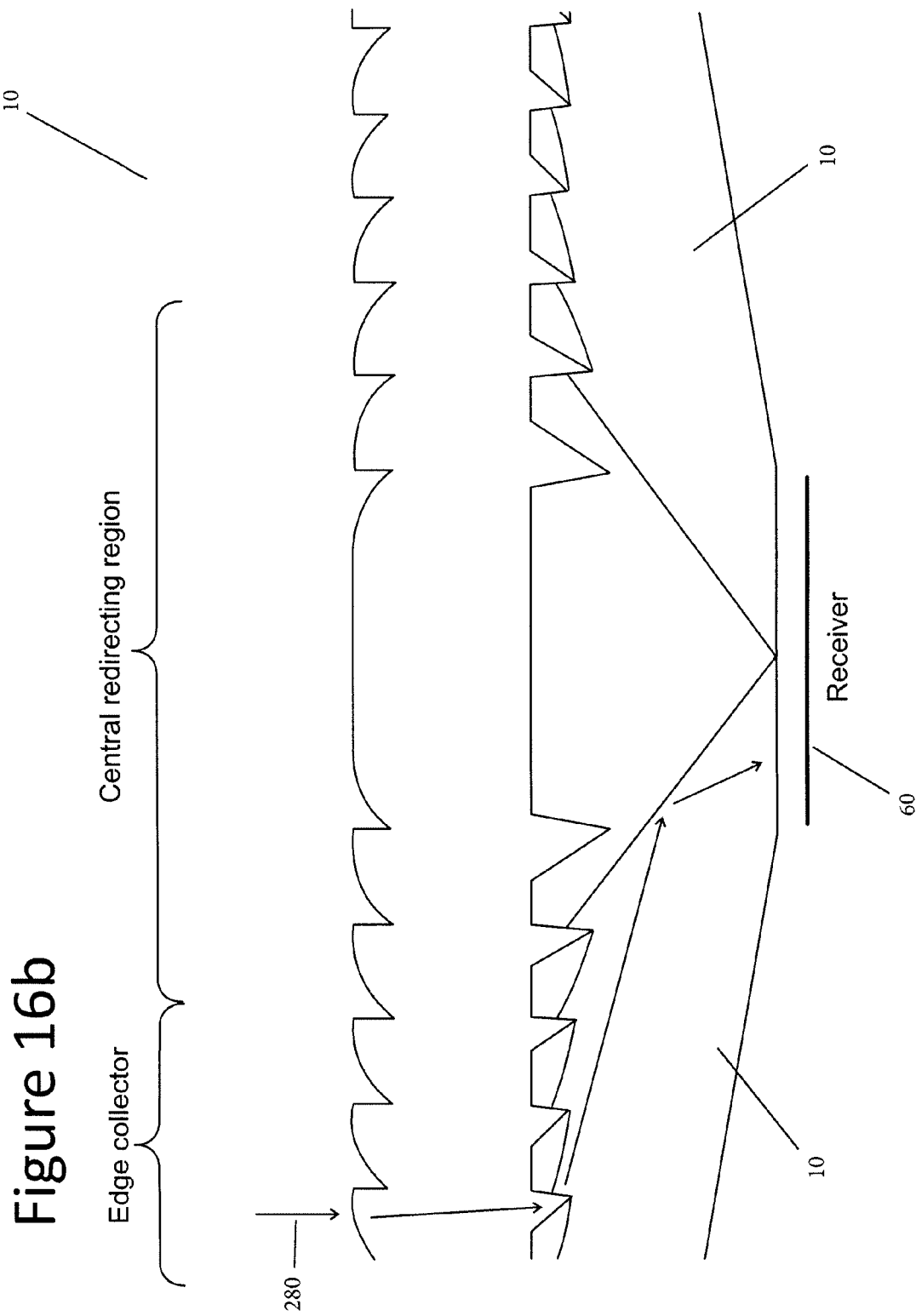

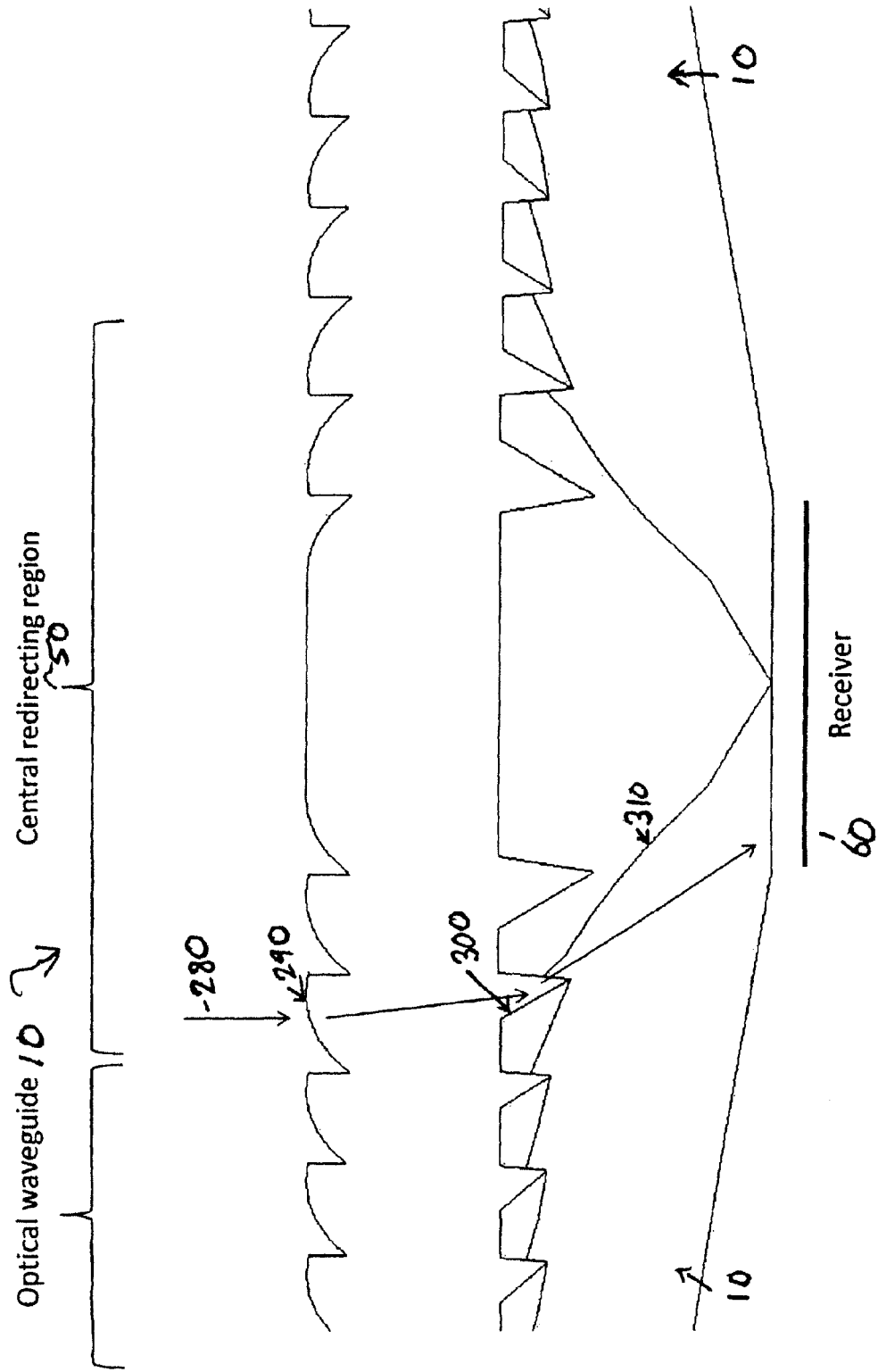

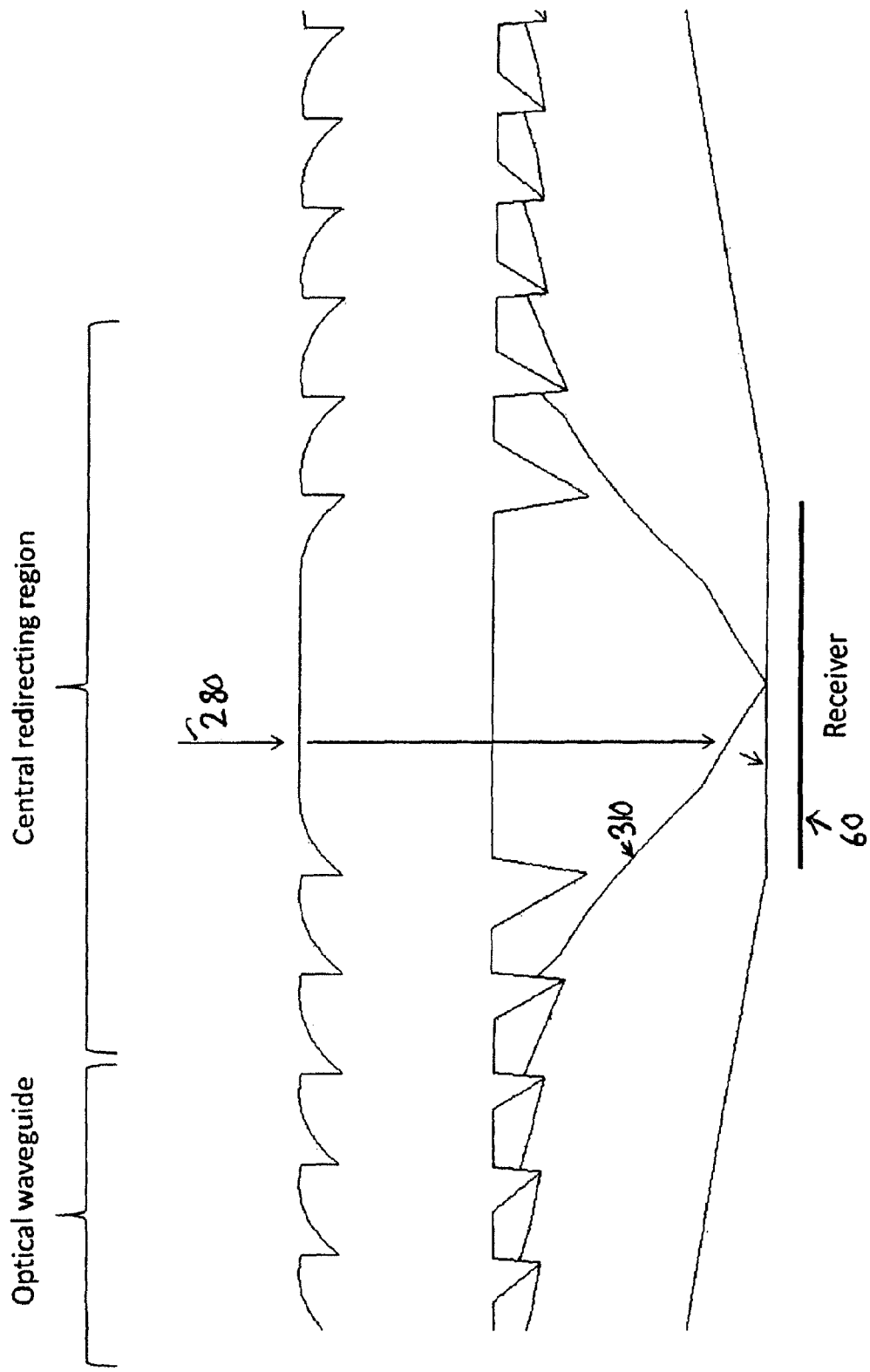

REDIRECTING OPTICS FOR CONCENTRATION AND ILLUMINATION SYSTEMS

CROSS REFERENCE TO RELATED APPLICATIONS

This application is a continuation of Ser. No. 13/282,147 filed Oct. 26, 2012, which claims the benefit of U.S. Provisional application No. 61/407,772. Ser. No. 13/282,147 is also a continuation-in-part of U.S. application Ser. No. 12/939,348 filed Nov. 4, 2010, which is a continuation of U.S. Ser. No. 12/705,434 filed Feb. 12, 2010, now U.S. Pat. No. 7,925,129, which is a continuation-in-part of U.S. application Ser. No. 12/207,346 filed Sep. 9, 2008, now U.S. Pat. No. 7,664,350, which is a continuation-in-part of U.S. application Ser. No. 11/852,854 filed Sep. 10, 2007, now U.S. Pat. No. 7,672,549, all of which are incorporated herein by reference in their entirety.

FIELD OF THE INVENTION

The invention is directed to the field of optics for light collection and delivery. Applications include concentration of sunlight onto photovoltaic or thermal receivers, and diffusion of light for illumination applications.

BACKGROUND AND SUMMARY OF THE INVENTION

Edge collectors or optical waveguides are used for collection and concentration of light; in particular, sunlight. An edge collector or optical waveguide is defined for this application as an optical device that receives light from a top surface, and delivers the concentrated energy to the edge of the device. FIG. 1a shows a simple schematic of the cross section of an optical waveguide 10. FIG. 1b is a 3D representation of the same optical waveguide 10.

In practice, these types of optical waveguides 10 are generally of the type described in U.S. Pat. Nos. 7,664,350 and 7,672,549. Other types of optical waveguides include luminescent solar concentrators, or dye luminescent solar concentrators. FIG. 1c shows an optical system of the former type. Input light 20 falls on multiple concentrating units 40 across the aperture, and the waveguide 10 collects the concentrated light from all the units and delivers it to an edge 30 of waveguide 10.

However, there are many advantages to having a secondary set of optics 50 (see FIGS. 2 and 3a) at the edge 30 to redirect the light 20 in a favorable manner. In FIG. 2, the light 20 is delivered to the edge 30 of the waveguide 10 and is redirected approximately 90 degrees towards a receiver 60 placed parallel to the base of the waveguide 10. The invention articulated herein describes a variety of methods to design these secondary redirecting optics 50. The invention helps make the optical waveguide 10 more useful. Key commercial criteria for the optical waveguide concentrating systems include compactness, efficiency, level of concentration, and manufacturability. Different methods for the redirection impact these criteria in different ways.

It should also be noted that the applications for this optical waveguide 10 or device are several. The light energy can be delivered to a variety of receivers. FIGS. 3a to 3d show some examples of receivers 60, including further concentrating or diffusing optics such as lenses, compound parabolic concentrating optics, photovoltaic cells, or heat exchangers which will be described in more detail hereinafter.

BRIEF DESCRIPTION OF THE DRAWINGS

FIG. 16a-e illustrates various embodiments of the optical system;

DETAILED DESCRIPTION OF PREFERRED EMBODIMENTS

Figure 1A:
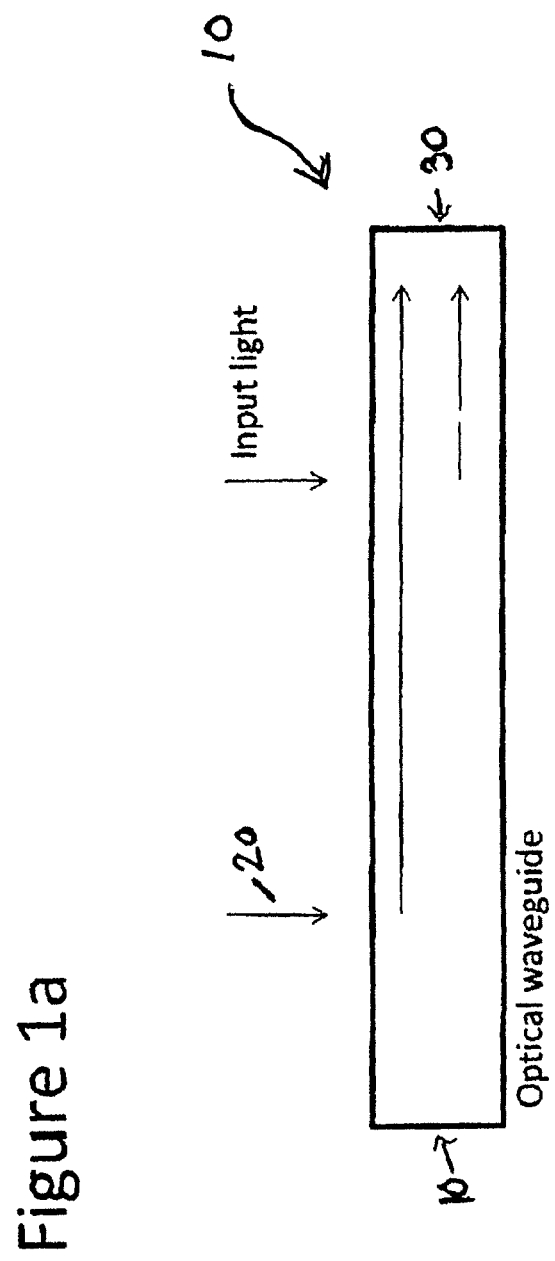
FIG. 1a illustrates a cross-sectional view of a conceptual optical waveguide.
Figure 1B:
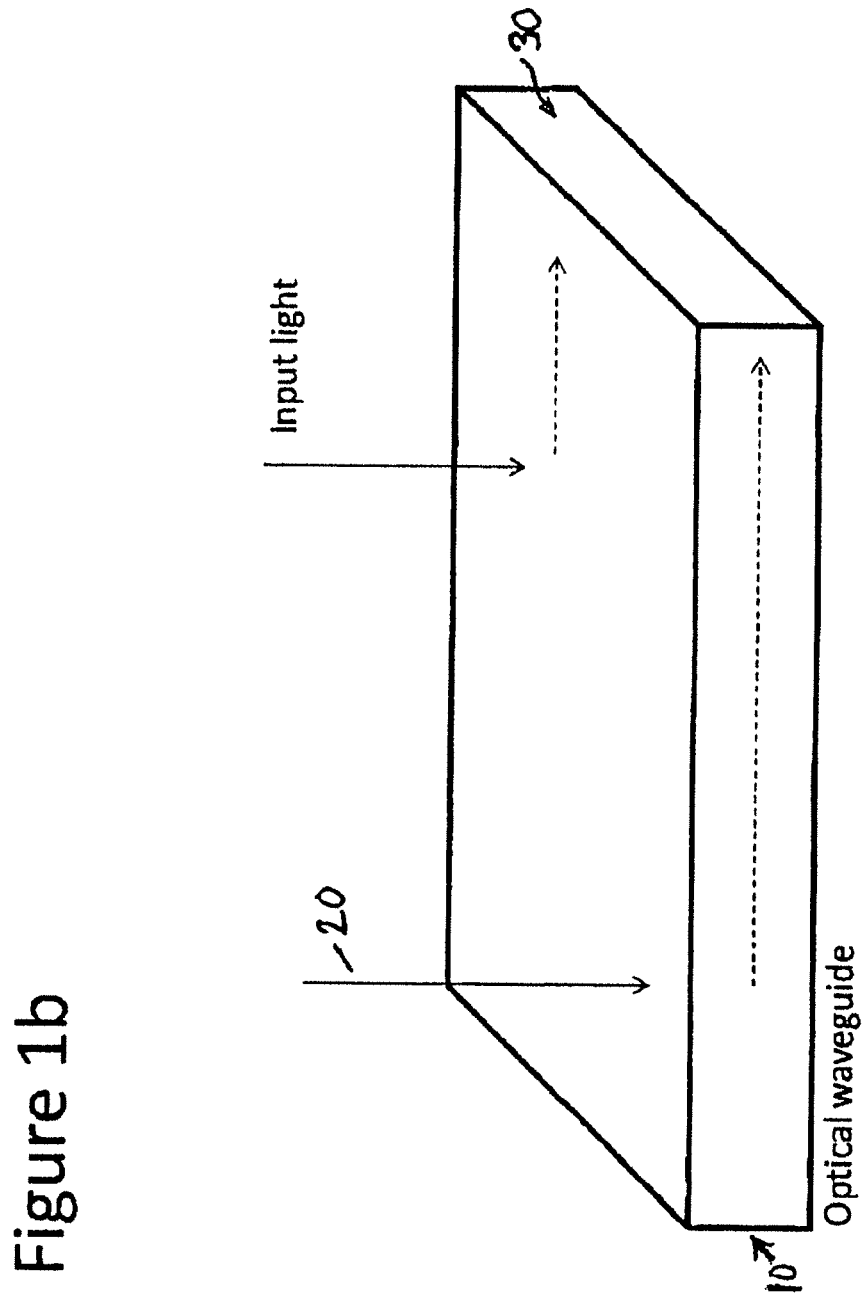
FIG. 1b illustrates a three-dimensional view of a conceptual optical waveguide.
Figure 1C:
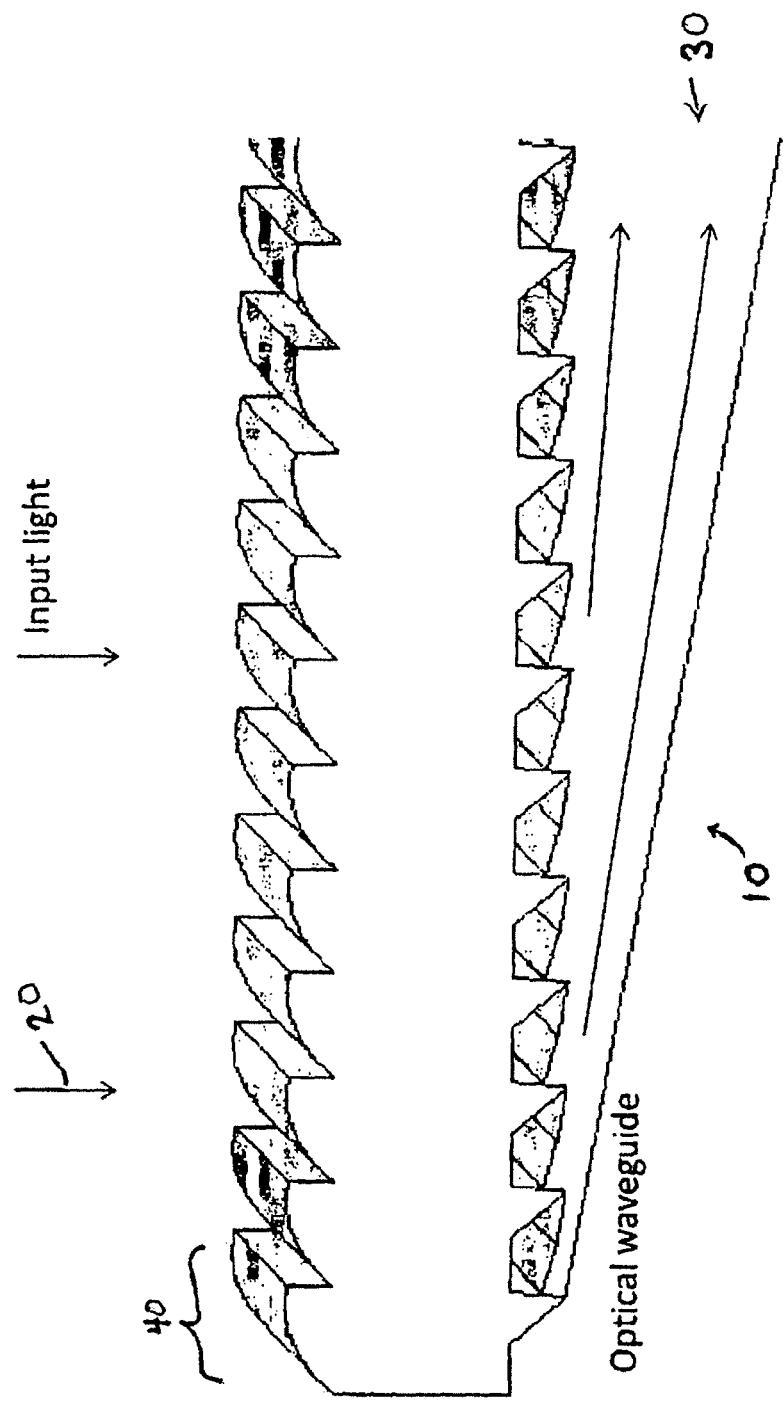
FIG. 1c illustrates an optical waveguide used in solar concentration.
Figure 2:
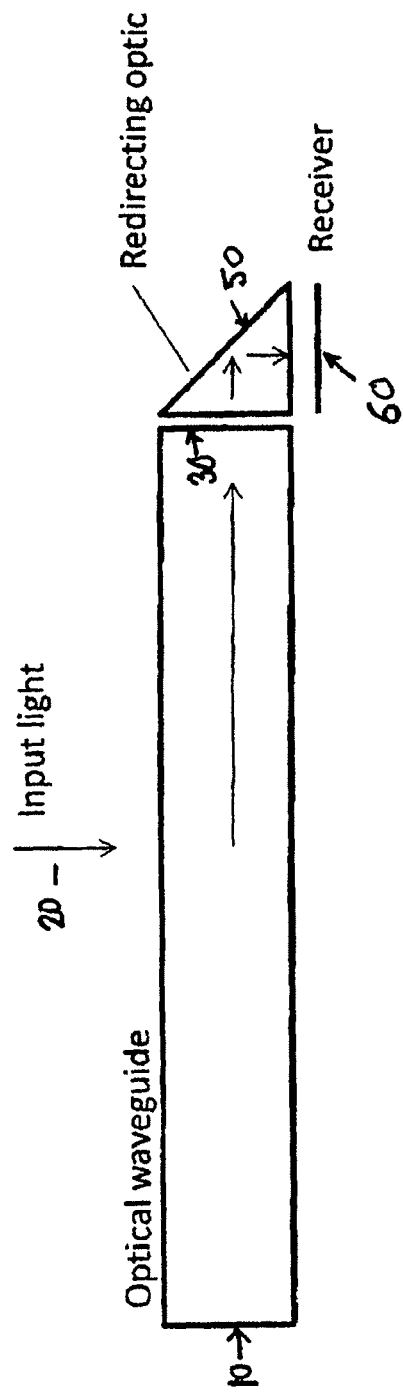
FIG. 2 illustrates an embodiment of the optical system.
Figure 3A:
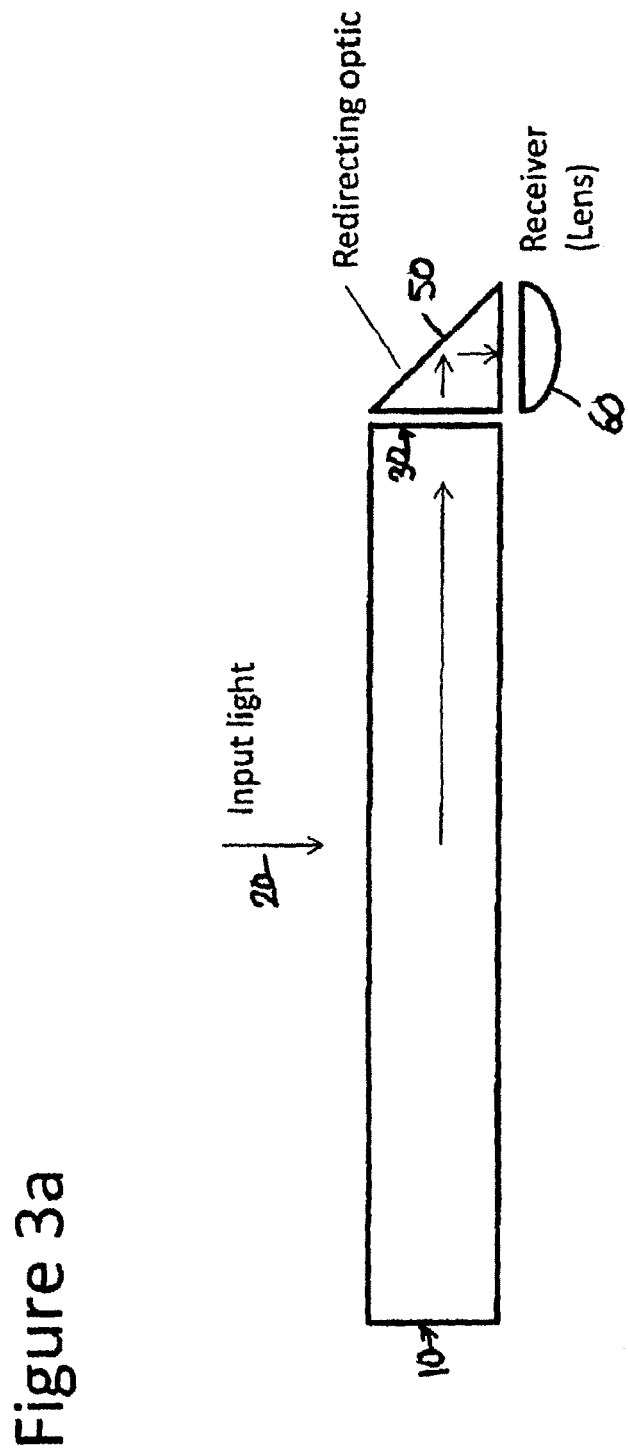
FIG. 3a illustrates an embodiment with a lens receiver.
Figure 3B:
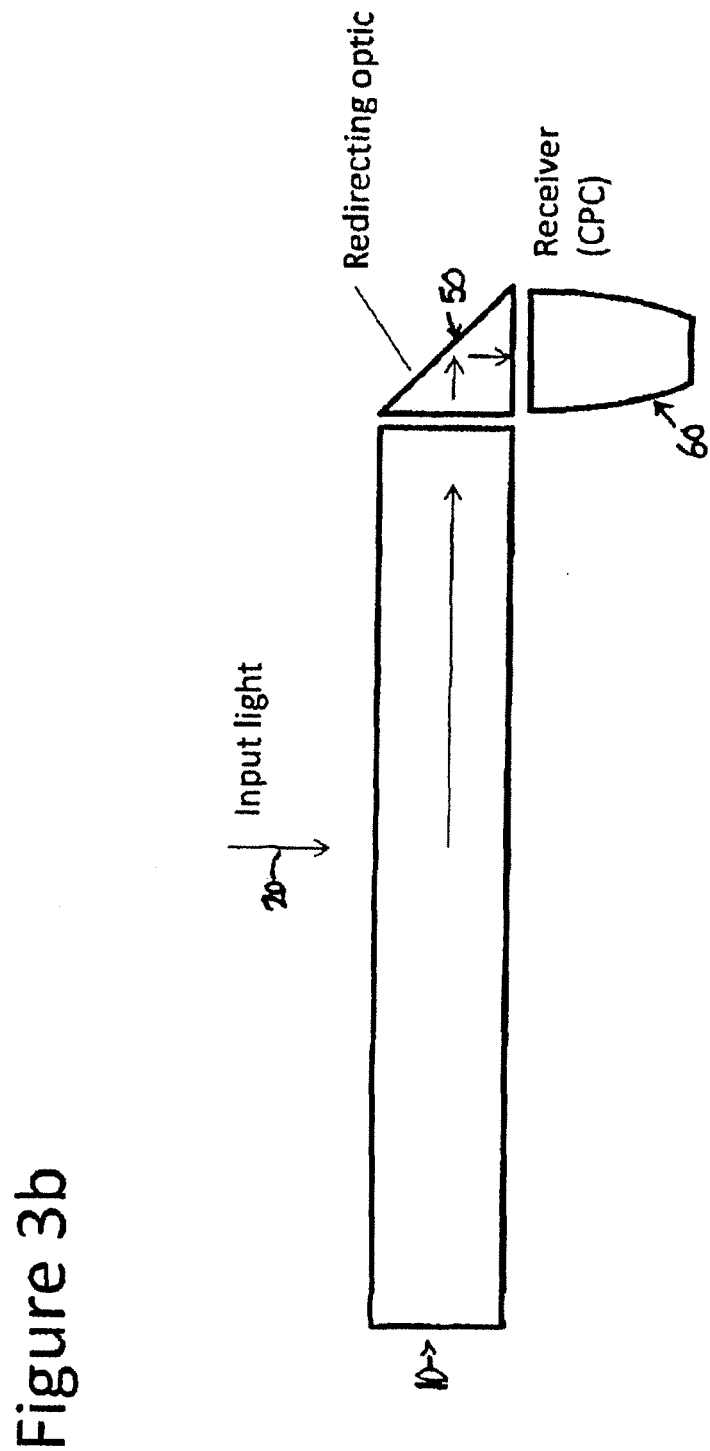
FIG. 3b illustrates an embodiment with a CPC receiver.
Figure 3C:
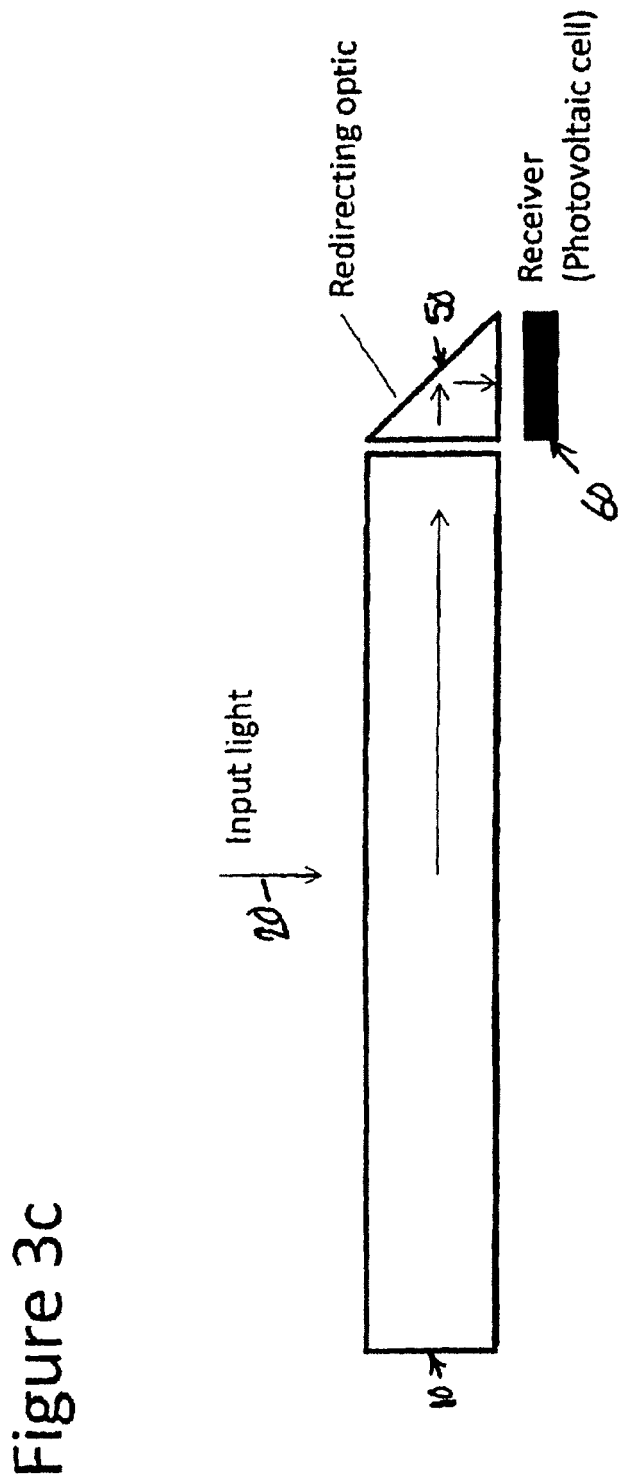
FIG. 3c illustrates an embodiment with a photovoltaic cell receiver.
Figure 3D:
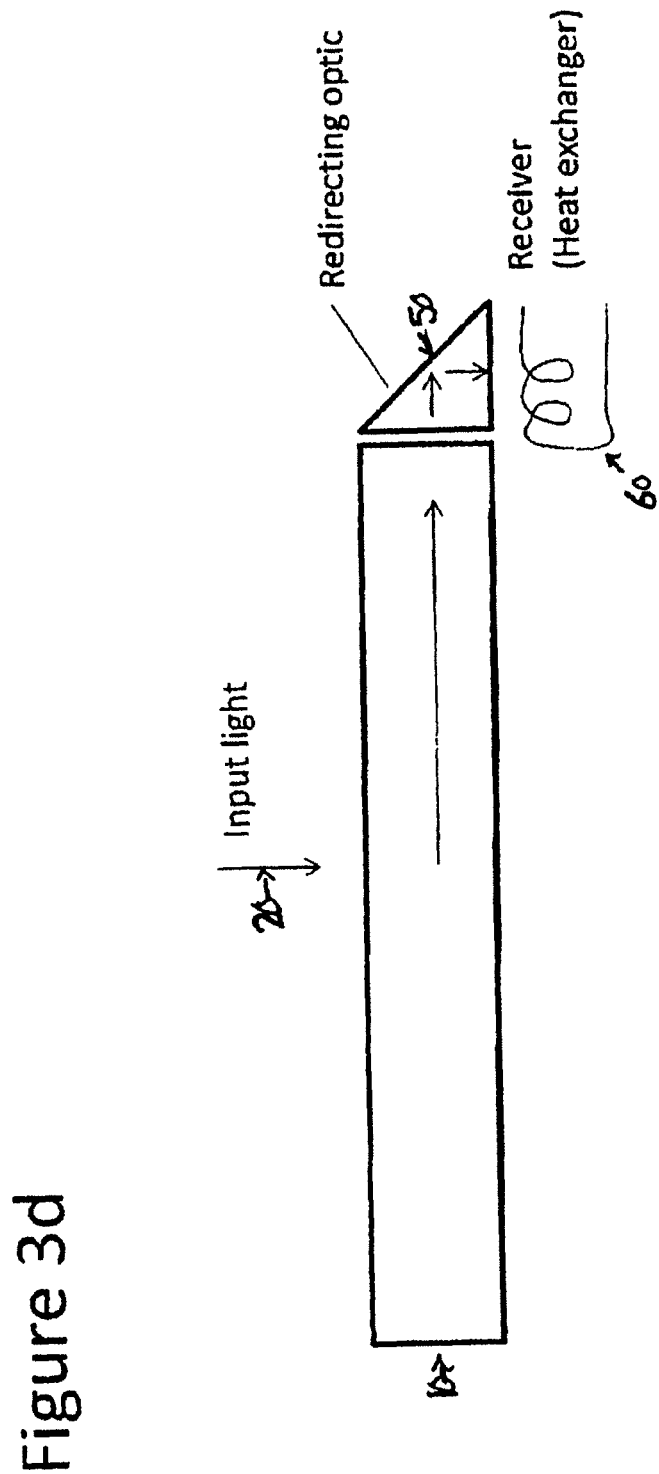
FIG. 3d illustrates an embodiment with a heat exchanger receiver.
Figure 4A:
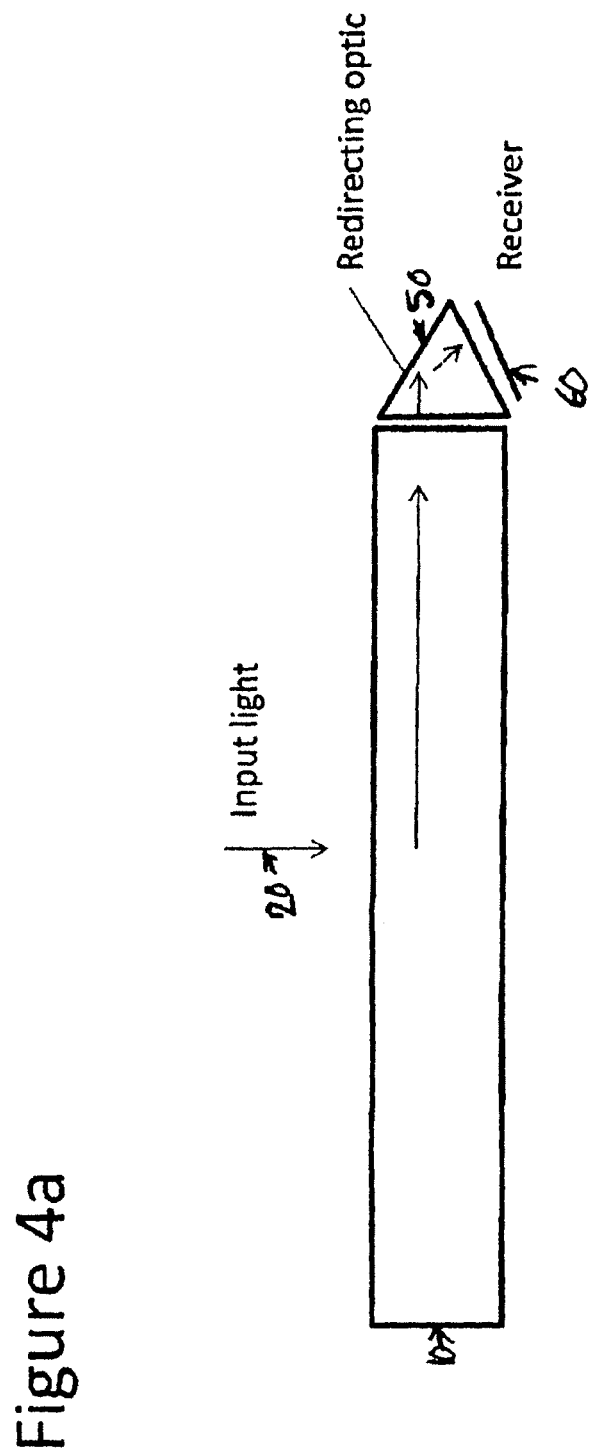
FIG. 4a illustrates another embodiment of the optical system.

In a preferred embodiment, as shown in FIG. 4a, light from the waveguide 10 travels roughly perpendicular to the plane of collection. The redirecting optics 50 redirects this light 20 to a receiver 60 so as to change the angle of propagation of the cone of the light 20.

Figure 4B:
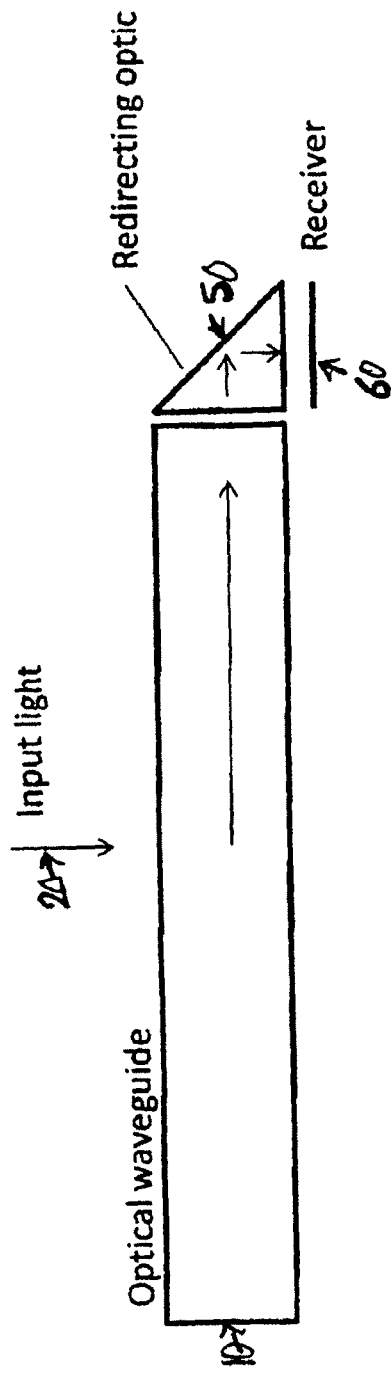
FIG. 4b illustrates another embodiment of the optical system.
Figure 4C:
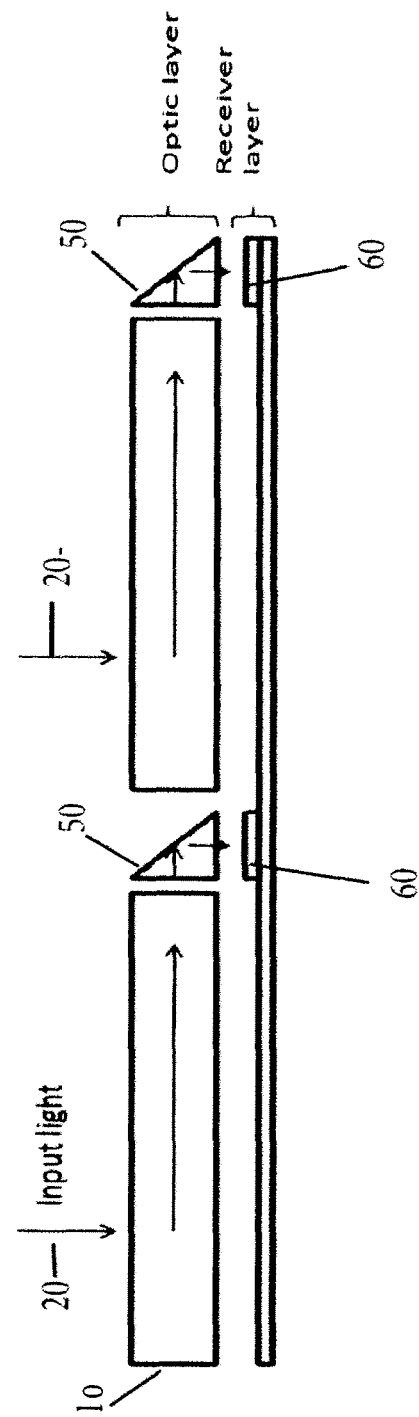
FIG. 4c illustrates multiple optical systems adjacent each other with redirecting optics.
Figure 4D:
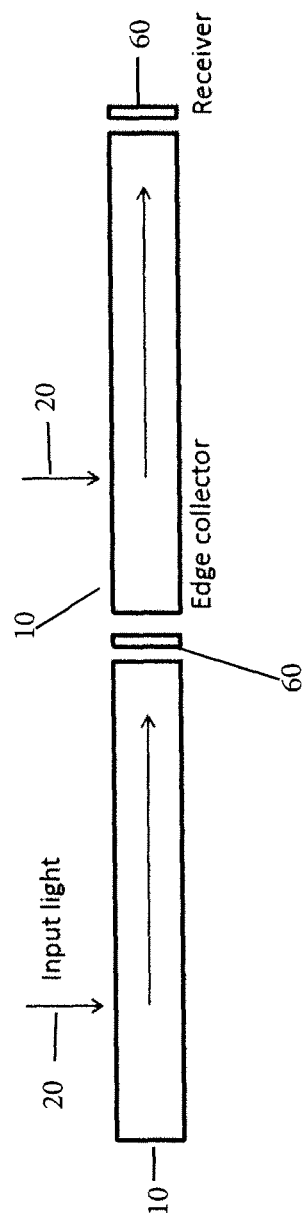
FIG. 4d illustrates multiple optical systems adjacent each other without redirecting optics.

In a preferred embodiment, the optical waveguide 10 redirects the light 20 substantially perpendicular to its angle of propagation in the waveguide 10, as shown in FIG. 4b. This enables the receiver 60 to lie parallel to the plane of collection, as in FIG. 4c. FIG. 4d shows how the waveguide 10 and receivers 60 interfere with one another if the optical waveguide 10 does not have redirecting optics associated therewith. The "optics layer" (the redirecting optics 50) and "receiver layer" (the receiver 60) thereby form horizontal slab sections that can be easily assembled and mated together. The two layers can form a laminate construction that is sturdy and durable. Connections between receivers 60 can be more easily made; for example, electrical interconnects between photovoltaic cell receivers. As the receiver 60 (e.g., photovoltaic cell) heats up, having a separate receiver layer enables more effective heat transfer off a back plane heat sink.

Each of the following sections outlines a specific problem being addressed by the redirecting optics 50 and some preferred methods of solving that problem.

1. Redirector as Same or Separate Part

Figure 5A:
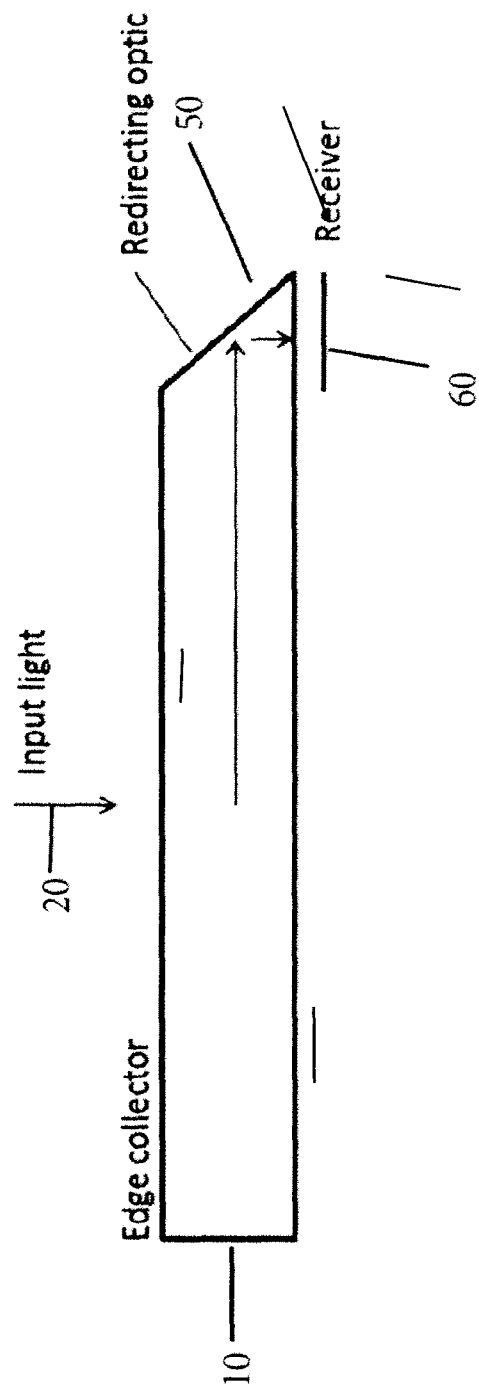
FIG. 5a illustrates an embodiment where the redirecting optic is integrated into the waveguide.
Figure 5B:
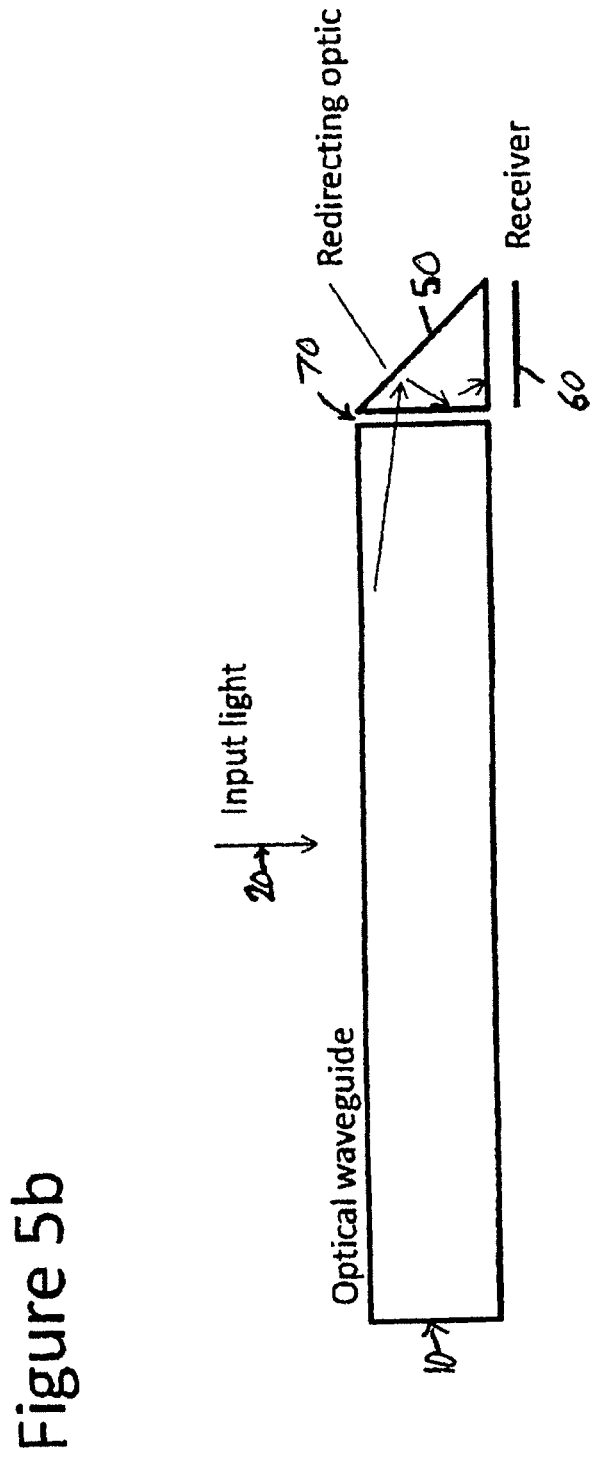
FIG. 5b illustrates an embodiment where the redirecting optic is separated from the waveguide.

The redirecting optics 50 can be constructed to be a feature of the same manufactured part as the waveguide optics 10, as shown in FIG. 5a. It can also be a separate part in another embodiment, as shown in FIG. 5b.

Being made in the same part has advantages for the waveguide 10—less manufacturing steps, no alignment required between parts, and potentially greater efficiency from no losses between interfaces.

Being made as a separate part for the components of the waveguide 10 and the redirecting optics 60 can help preserve or enhance the level of light concentration. The interface 70 can act as a totally internally reflecting (TIR) surface and thus better contain the light 20 within the waveguide 10.

2. Mirror Image

Figure 6A:
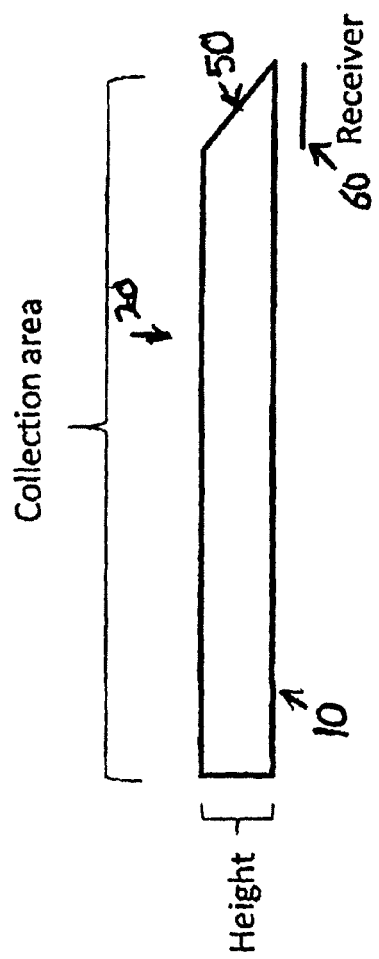
FIGS. 6a-b illustrate an embodiment where the optical system is mirrored about a central axis.

FIG. 6a shows an optical waveguide 10 and redirecting optics 50 as previously discussed, with the collection area of input light 20 and the height of the optics components noted.

Figure 6B:
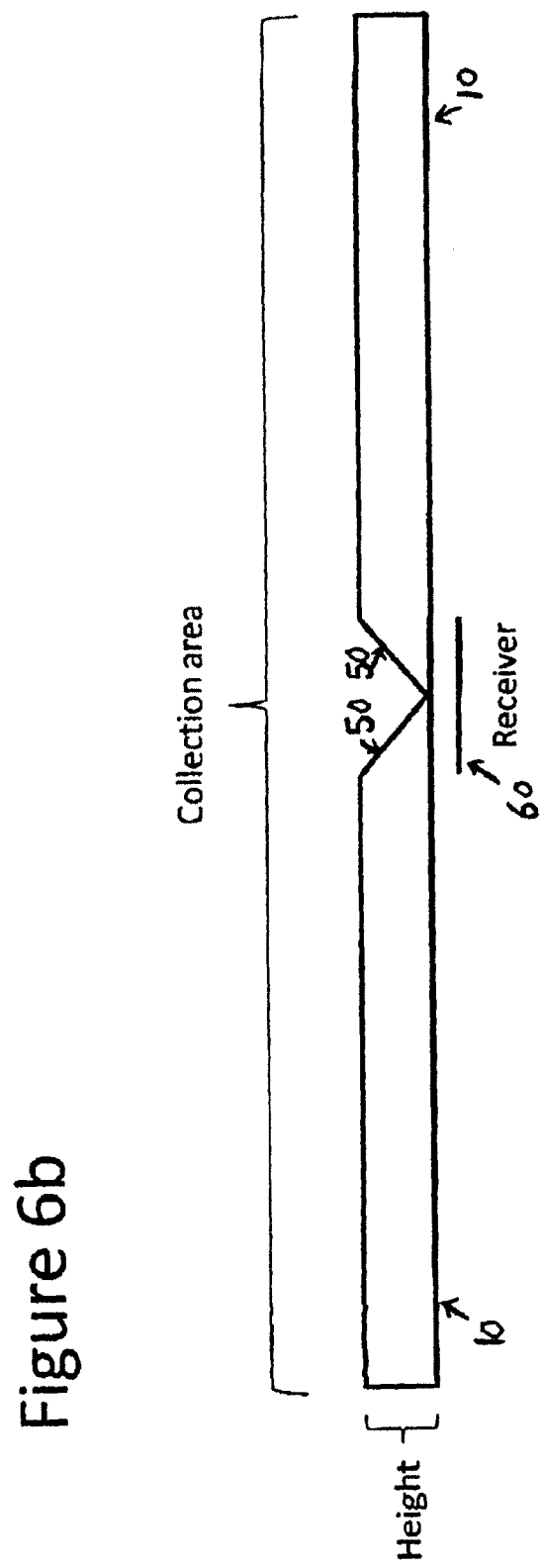

In FIG. 6b, the combination of the waveguide 10 optics, redirecting optics 50, and the receiver 60 is mirrored about a central axis. The receiver 60 can then be constructed as one contiguous part. The collection area delivering light to a single receiver 60 is thus doubled while the height of the total construction is not changed—therefore the construction is twice as compact for a given area of receiver 60.

Additionally, the entire mirrored waveguide and redirecting combination can be manufactured in one part, thereby simplifying manufacturing.

3. Secondary Concentration

Figure 7A:
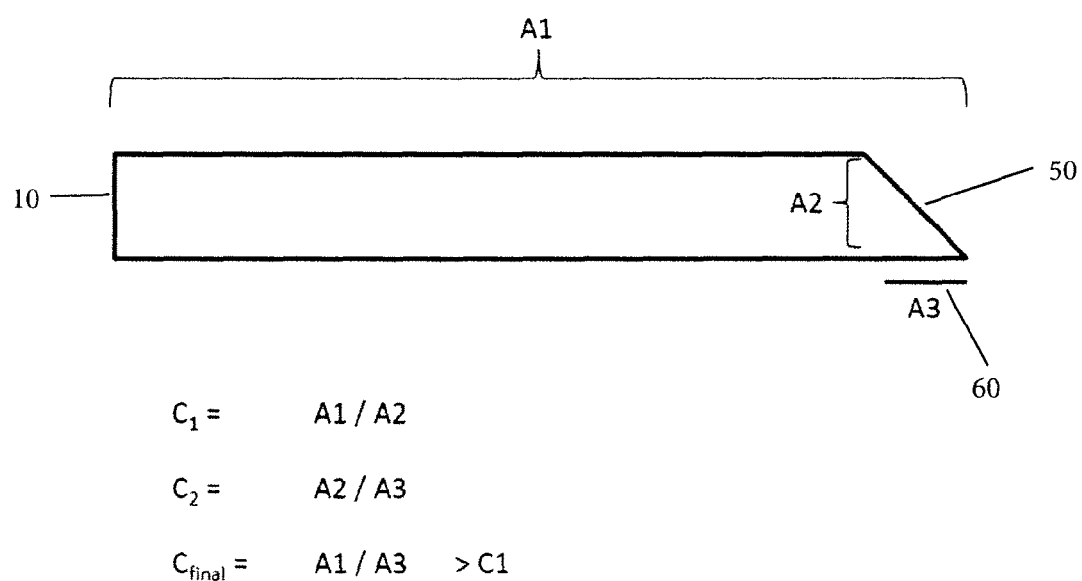
FIGS. 7a-c illustrate embodiments where the redirecting optics modify the level of concentration.

The optical waveguide 10 delivers a certain level of concentration, shown as C1 in the embodiment of FIG. 7a, defined by the collection area A1 divided by the area of the edge A2. The redirecting optic 50 receives the light 20 at this level of concentration and may change the level of concentration upon delivery to the receiver 60.

The secondary concentration caused by the redirecting optic 50 is shown as C2 and defined as the ratio of A2, the input area for the redirecting optic 50, and A3, the output area for the redirecting optic 50. The final level of concentration is shown as Cfinal and defined as A1/A3.

In FIG. 7a, the redirecting optic 50 increases the level of concentration from the optical waveguide 10. Cfinal is therefore greater than C1. When concentration factor is a critical parameter, such as in reducing the area of photovoltaic cell material in order to reduce costs of solar panels, secondary concentration from the redirecting optic 50 can be beneficial.

Figure 7B:
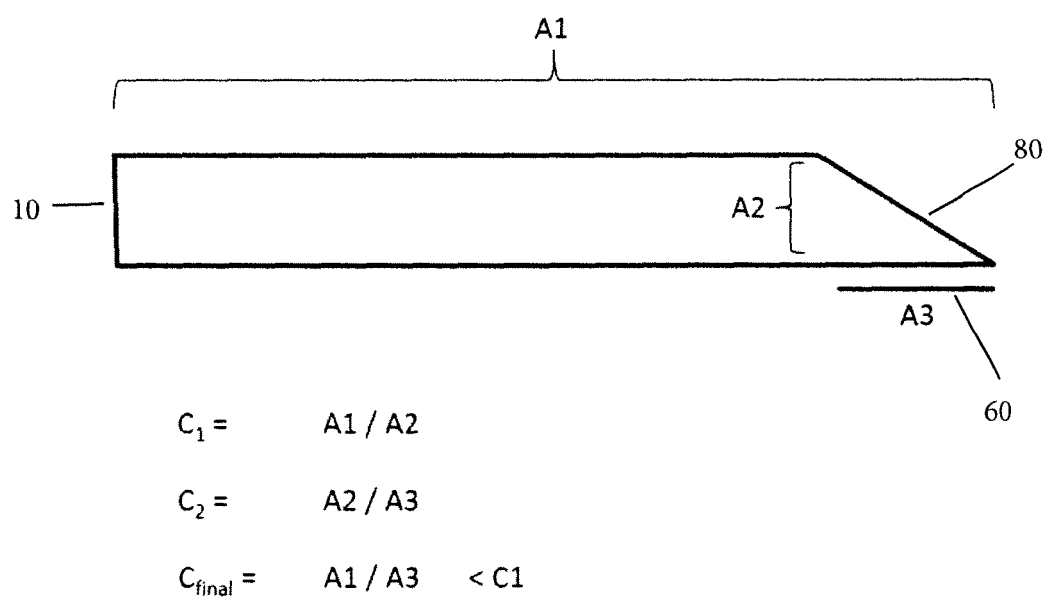
Figure 7C:
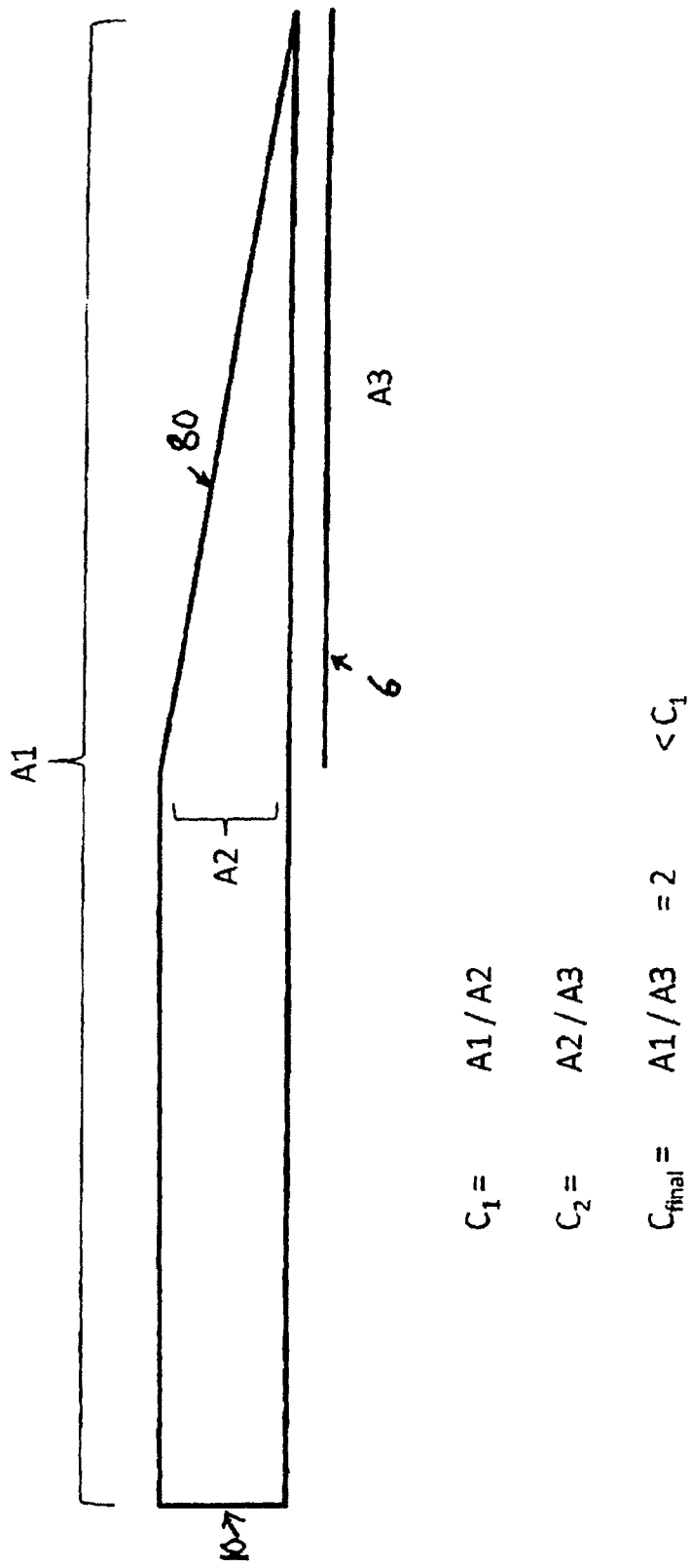

In the embodiment of FIG. 7b, the redirecting optic 50 reduces the level of concentration from the optical waveguide 10 (Cfinal<C1). In the particular embodiment of FIG. 7b, a simple flat facet 80 is disposed at an appropriately shallow angle with respect to the horizontal base of the optical waveguide 10, or the edge collector, and can deliver a reduction in concentration. In FIG. 7c this embodiment provides a further example. Even though the optical waveguide 10 delivered an appreciable level of concentration, the redirecting optic 80 reduced the final concentration factor to about 2×. This can be beneficial when, for example, it is desired to reduce solar cell material by a factor of two, and also to have large areas of contiguous solar cell, all the while having the overall optical system be highly compact.

4. Limitations of Total Internal Reflection

Total internal reflection (TIR) can be employed to reflect the light 20 for redirection. It is superior to a reflective coating as it is nearly lossless, while a coating will absorb some of the energy falling on it. It is also cheaper as it removes the extra manufacturing step and material cost of a reflective coating.

However, total internal reflection takes place only for light rays providing angles of incidence larger than the critical angle formed by the refractive indices of the optic and the surrounding material.

Figure 8A:
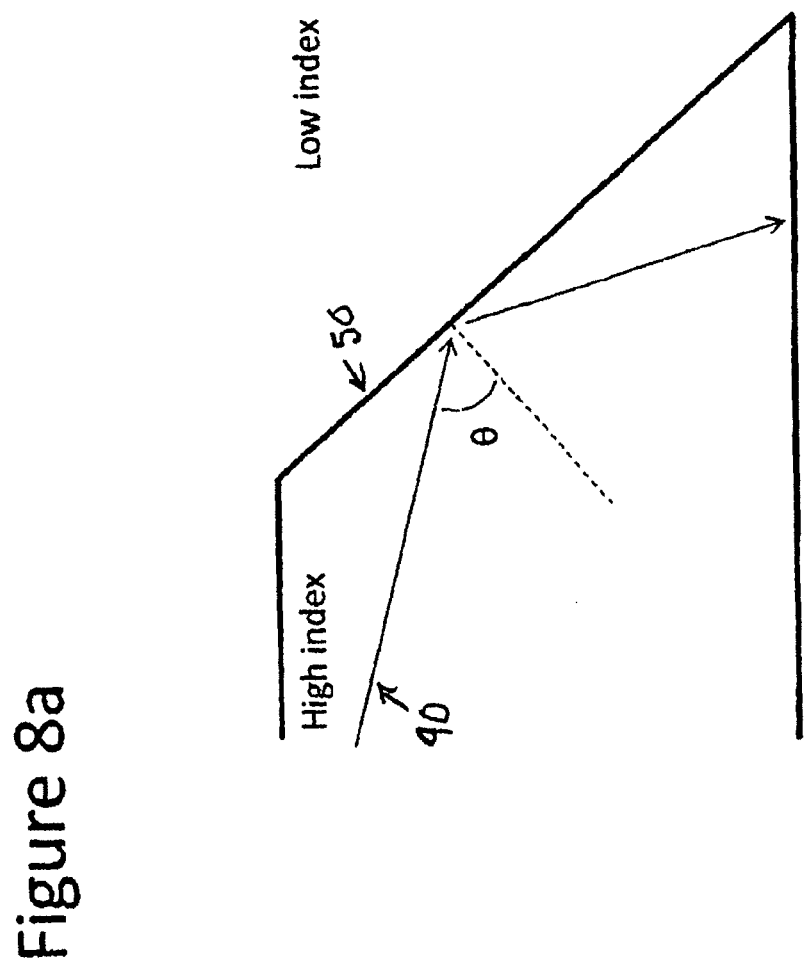
FIG. 8a illustrates a redirecting optic employing total internal reflection.
Figure 14A:
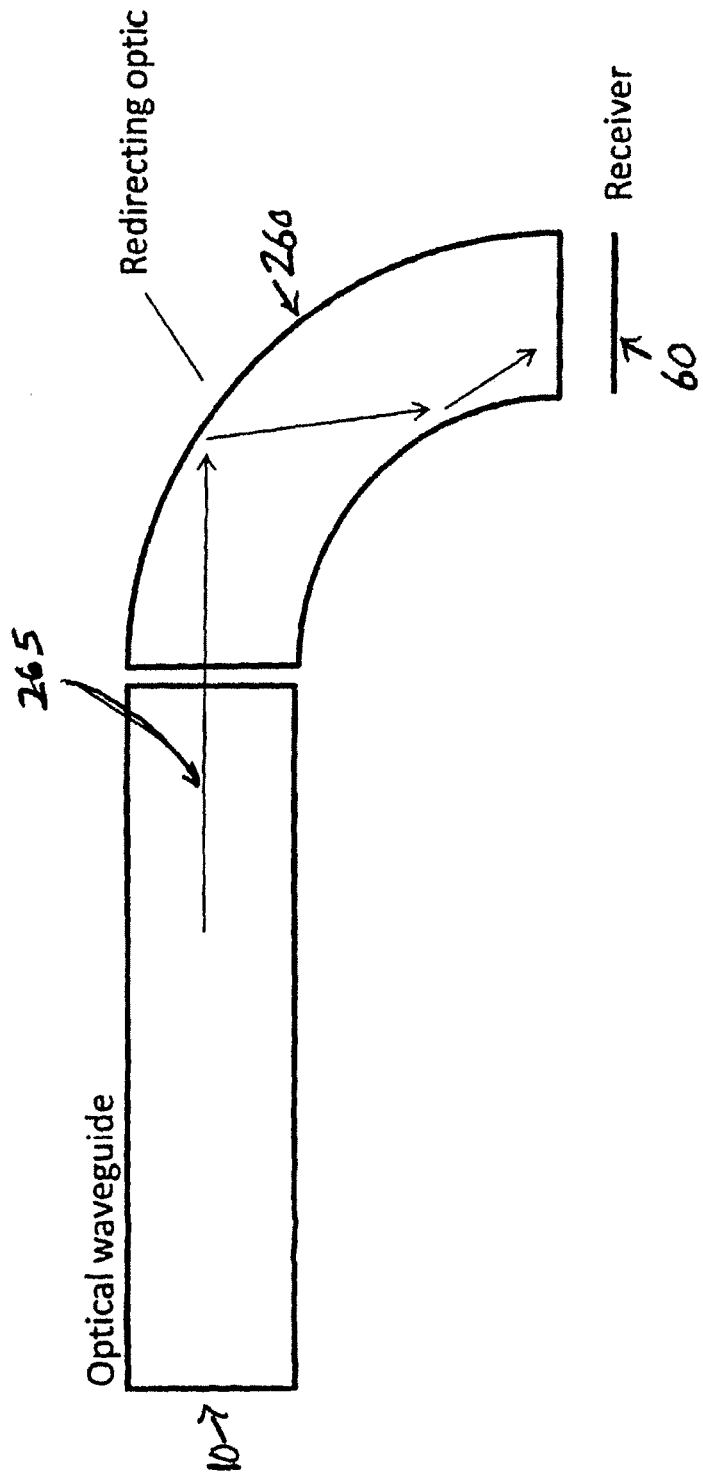
FIGS. 14a-c illustrate various embodiments of light pipe redirecting optics.
Figure 14B:
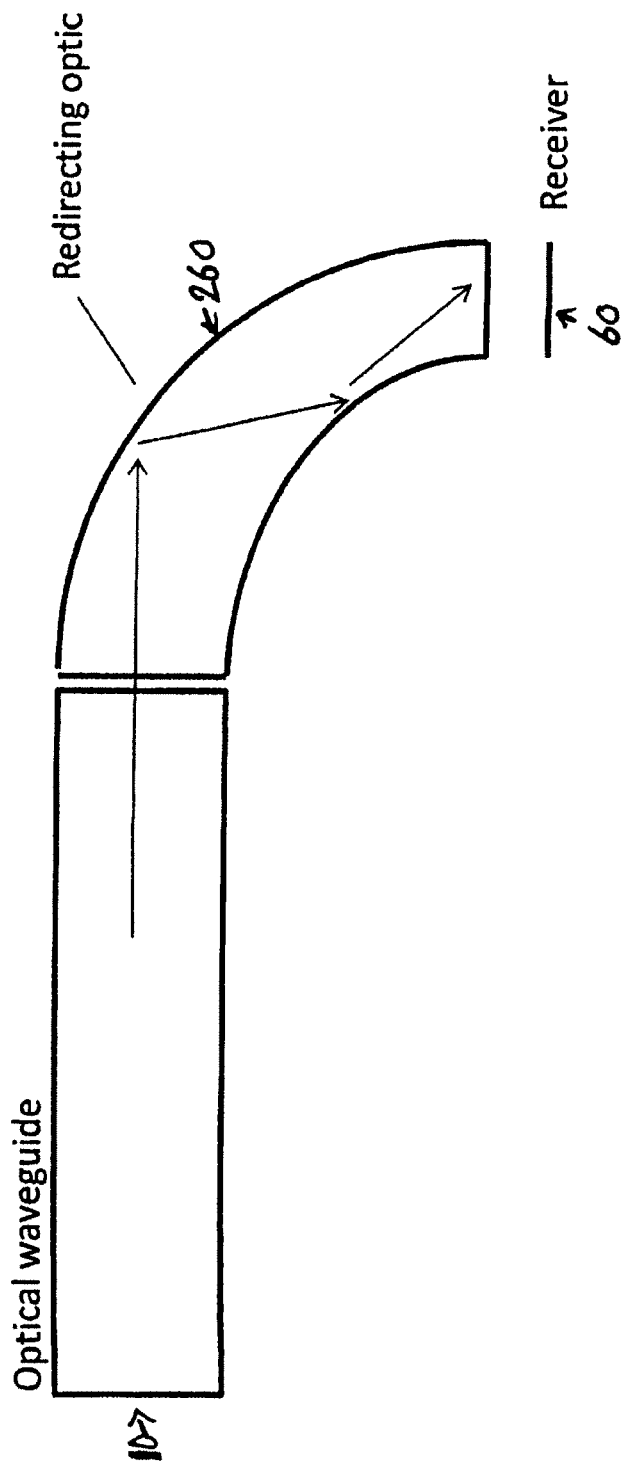
Figure 14C:
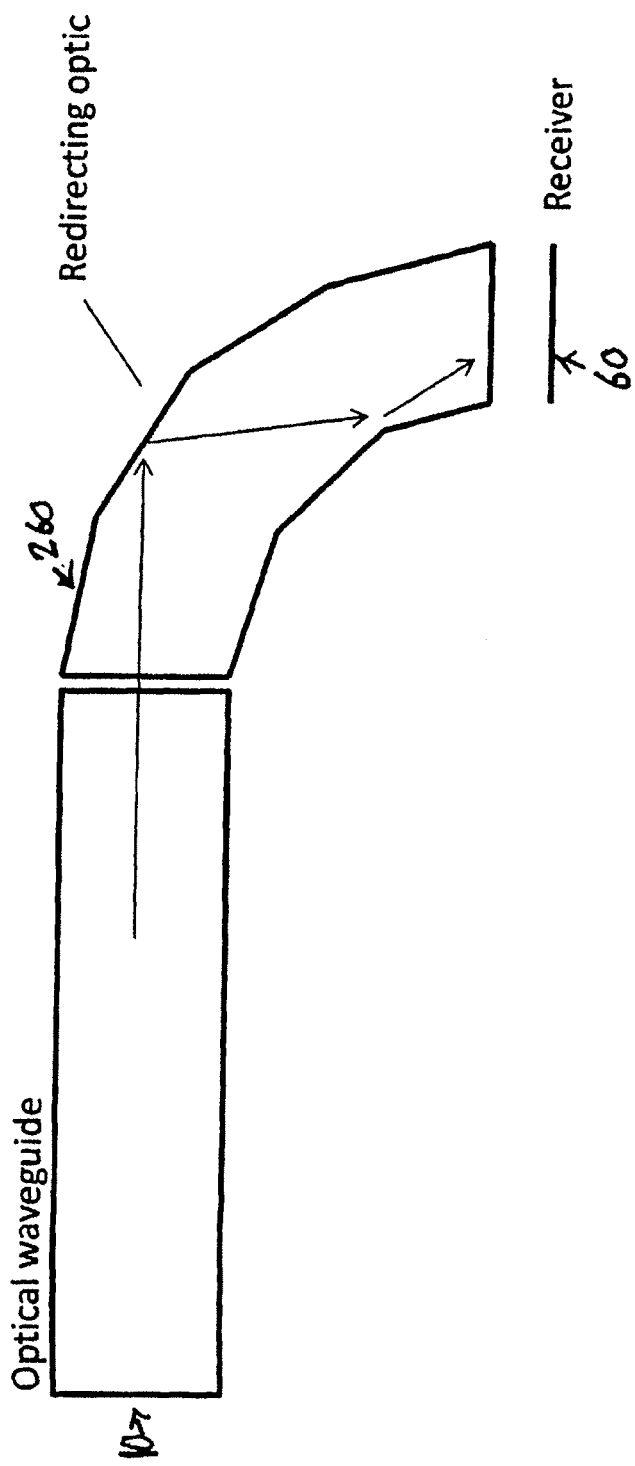

In the embodiment of FIG. 8a is shown a flat redirecting optic 50 at the TIR limit. The angle theta formed between the light ray 90 and the normal to the interface is just larger than the critical angle. FIGS. 14a-c show what happens when the angle of the light ray 90 is smaller than the critical angle—the ray is refracted through the redirecting optic 50 surface and is not delivered to the receiver 60. A requirement to employ TIR thus places a constraint on how much additional secondary concentration can occur while preserving efficiency.

5. Reflective Coatings

Figure 8B:
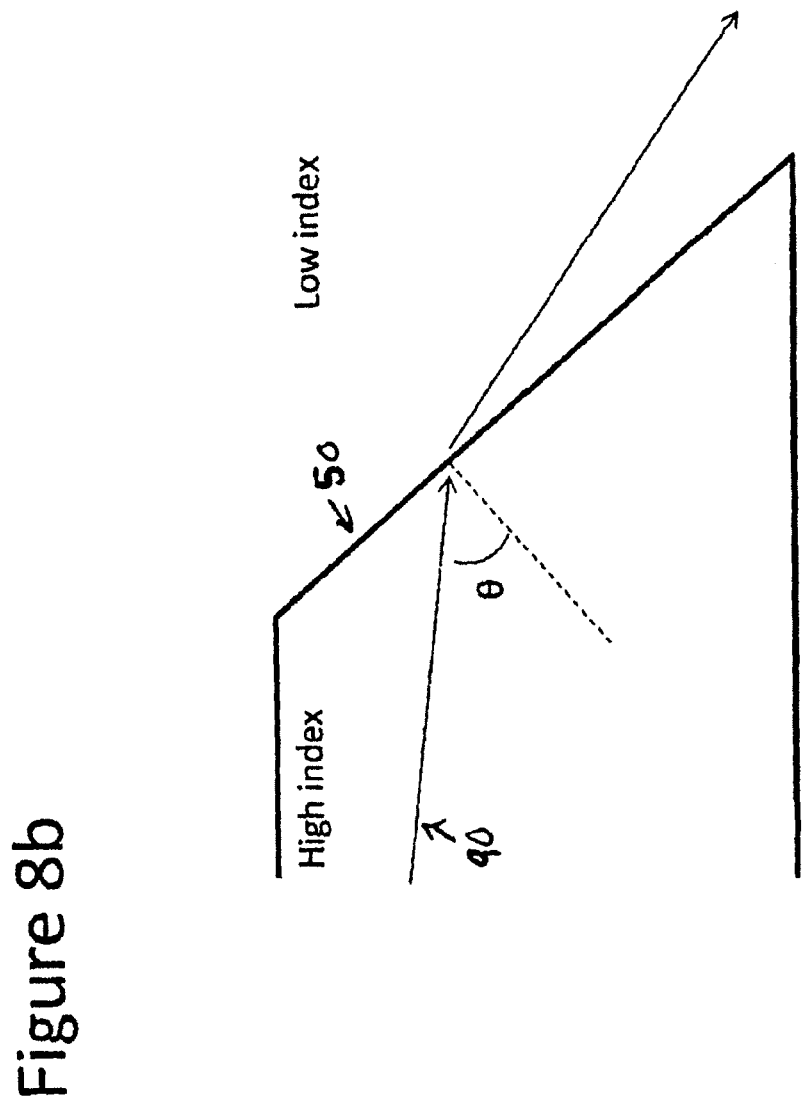
FIG. 8b illustrates a redirecting optic employing partial refraction.
Figure 9:
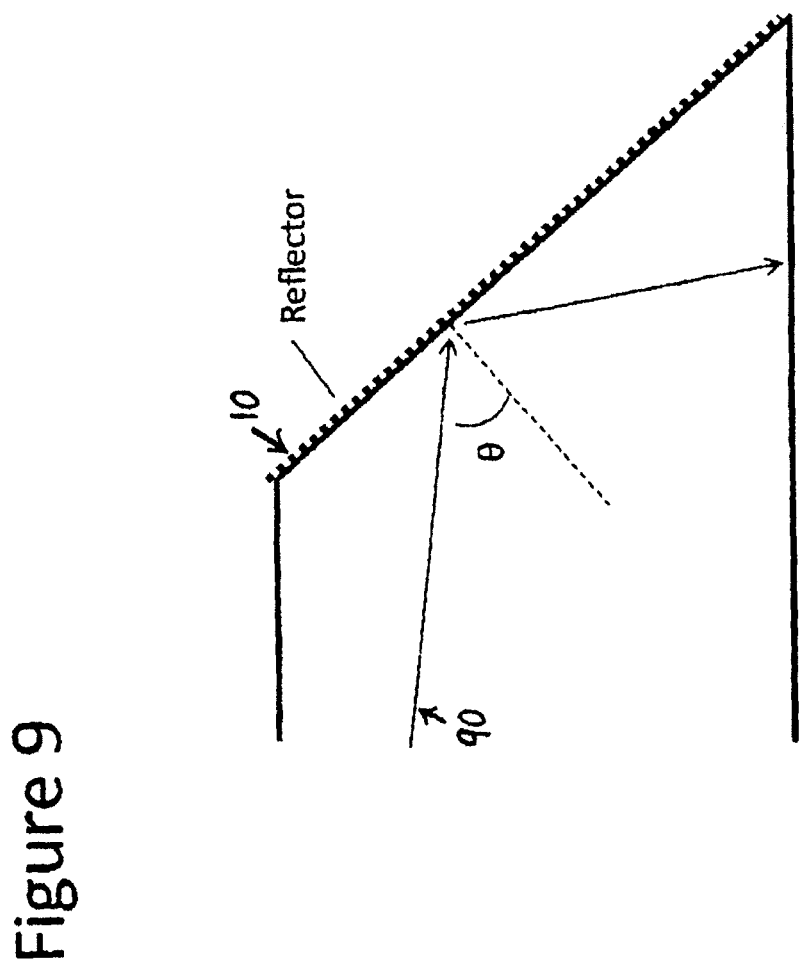
FIG. 9 illustrates a redirecting optic employing reflection.

In another embodiment reflective coatings may be employed to concentrate the light further than the TIR limit allows. FIG. 9 shows this embodiment. In this case, the angle of incidence is similar to that in FIG. 8b where the light 90 was essentially lost. Here, the light ray 90 is instead reflected down towards the receiver 60. A reflector 100 thus allows the redirecting optics 50 to have a form which provides a steeper incline with respect to the optical waveguide 10 which can enhance secondary concentration without losing light rays through the interface. (However, as described in section 4 hereinafter, the tradeoff on efficiency is that a reflector absorbs some of the energy falling on it).

6. Curved Redirecting Optics

Figure 10A:
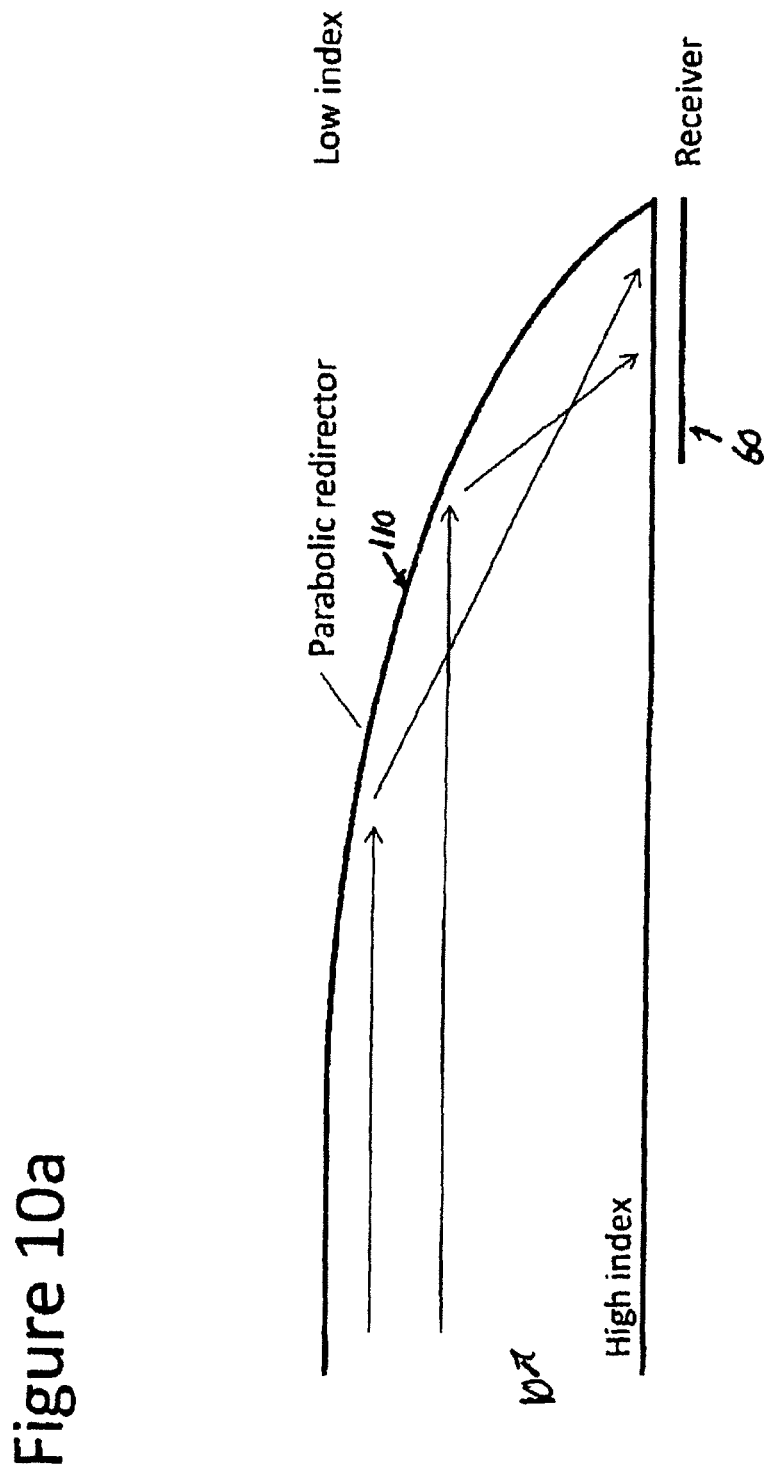
FIG. 10a illustrates a redirecting optic comprised of a parabolic curve.

A curved section such as a parabolic section 110 in FIG. 10a can be more effective than a flat surface at delivering secondary concentration. A curve, such as a parabola, is a focusing optical surface and therefore can take a light cone from the optical waveguide 10 and perform a secondary level of concentration on it, delivered to a receiver 60.

Figure 10B:
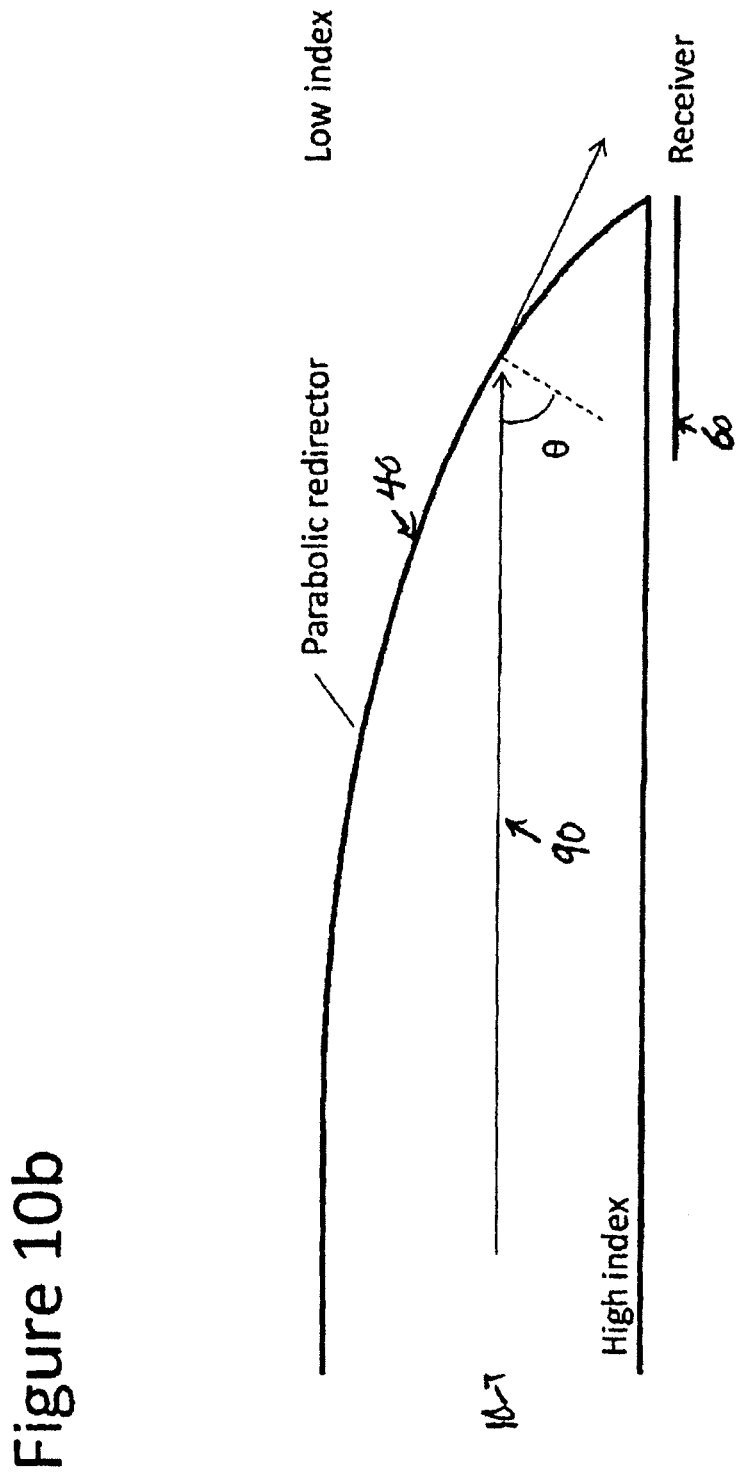
FIG. 10b illustrates a redirecting optic comprised of a parabolic curve with partial refraction.
Figure 10C:
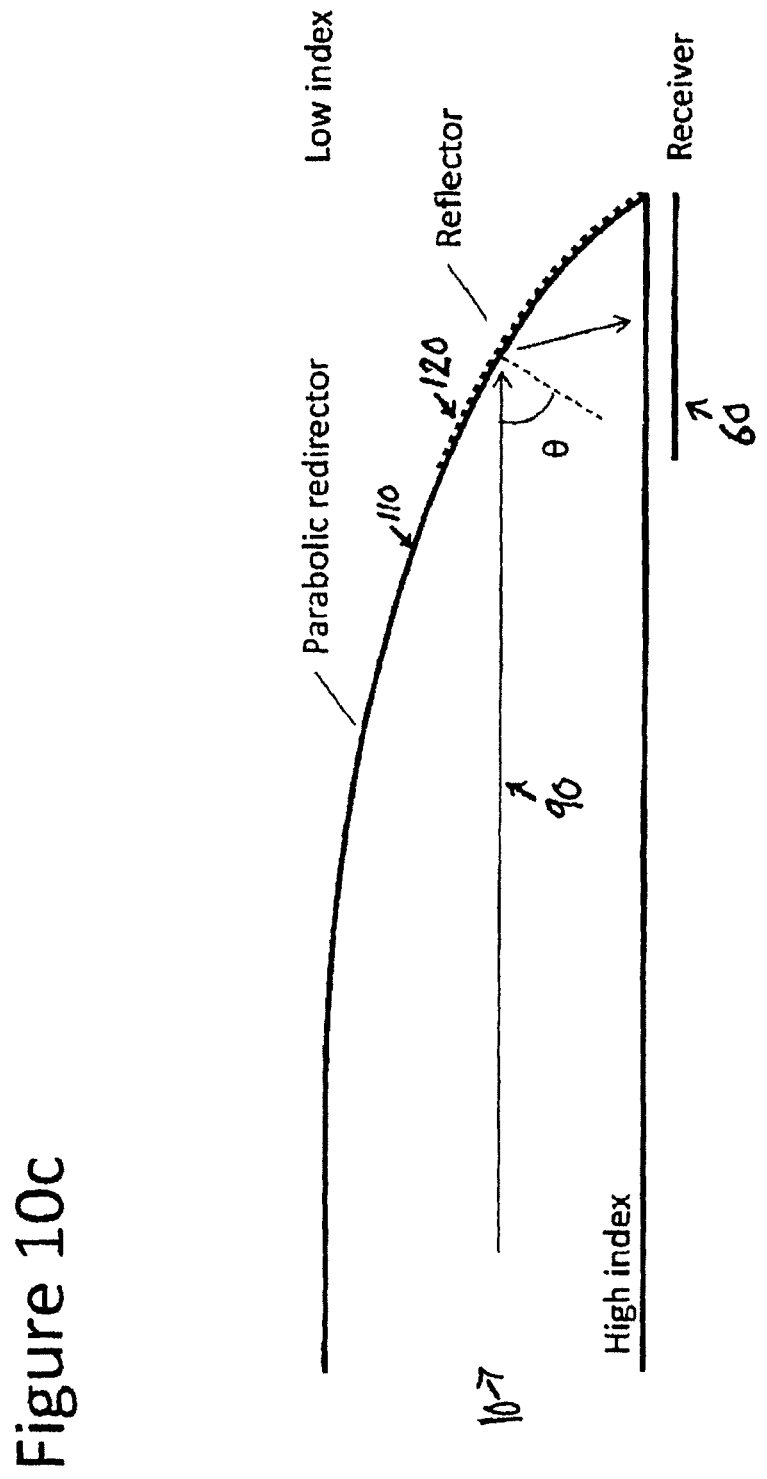
FIG. 10c illustrates a redirecting optic comprised of a parabolic curve with a partial reflective material.
Figure 10D:
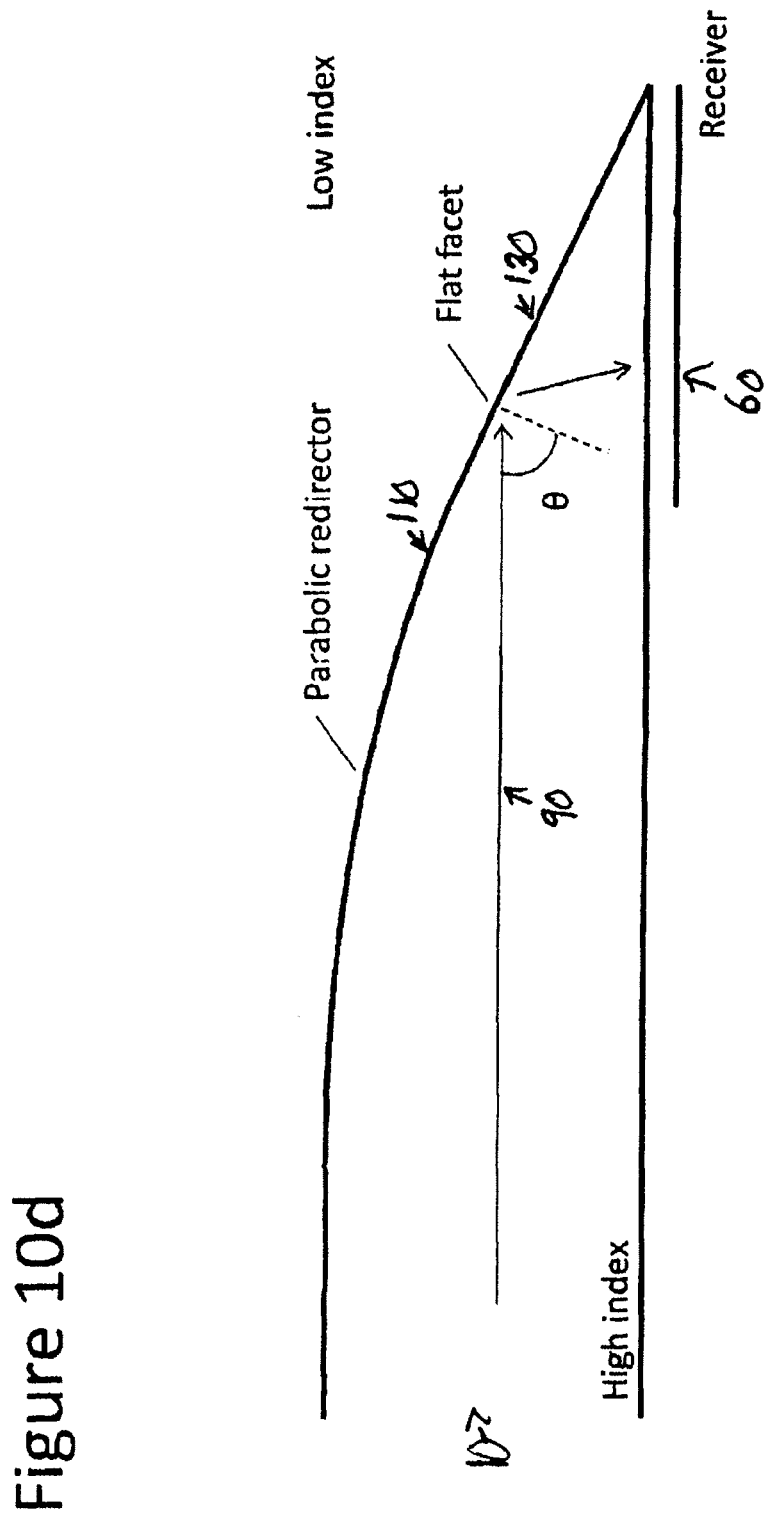
FIG. 10d illustrates a redirecting optic comprised of a parabolic curve and a flat facet.

However, the curve 110 can become steep enough to have the incident angle of light 90 exceed the critical angle for total internal reflection, as shown in FIG. 10b. Two solutions are possible. First, a reflective coating 120 may be applied to the section of the curve 110 that would otherwise see light leaking out, as shown in FIG. 10c. Second, the parabola 110 can be truncated at the TIR limit, and a flat facet 130 be used at the very same angle as the end of the curve, such that TIR is always achieved along the redirecting optic. This feature is shown in FIG. 10d.

7. TIR "Leaking"

Figure 11A:
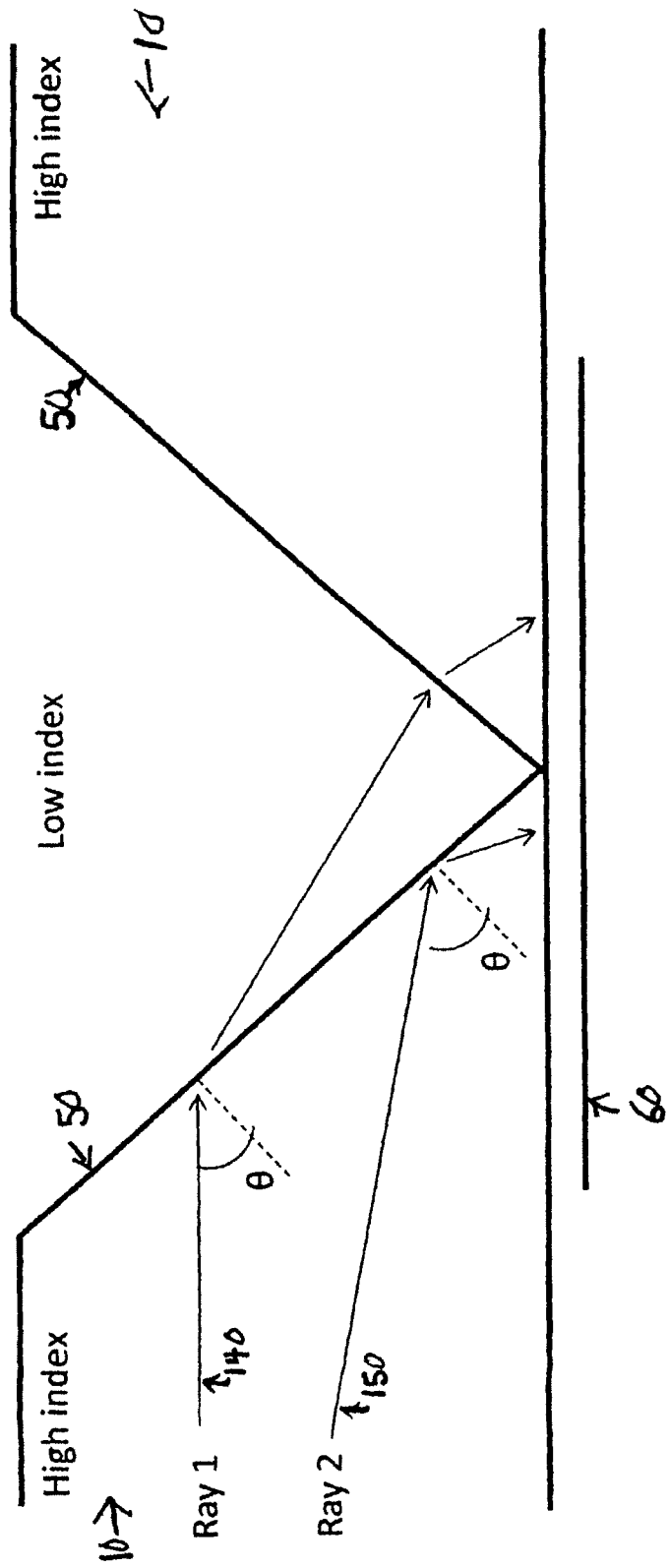
FIG. 11a illustrates an embodiment of redirecting optics showing TIR leaking.

In yet another embodiment when the optical waveguide 10 and redirecting optic 60 are mirrored, some leaking of light 140 from the redirecting optic 50 surface may be tolerated, since it is collected by the opposite redirecting surface and delivered to the receiver 60, as shown in FIG. 11a. This can increase the secondary concentration achievable because the redirecting optic 50 surface can be placed at a steeper angle and therefore shrink the required area of the receiver 60.

Figure 11B:
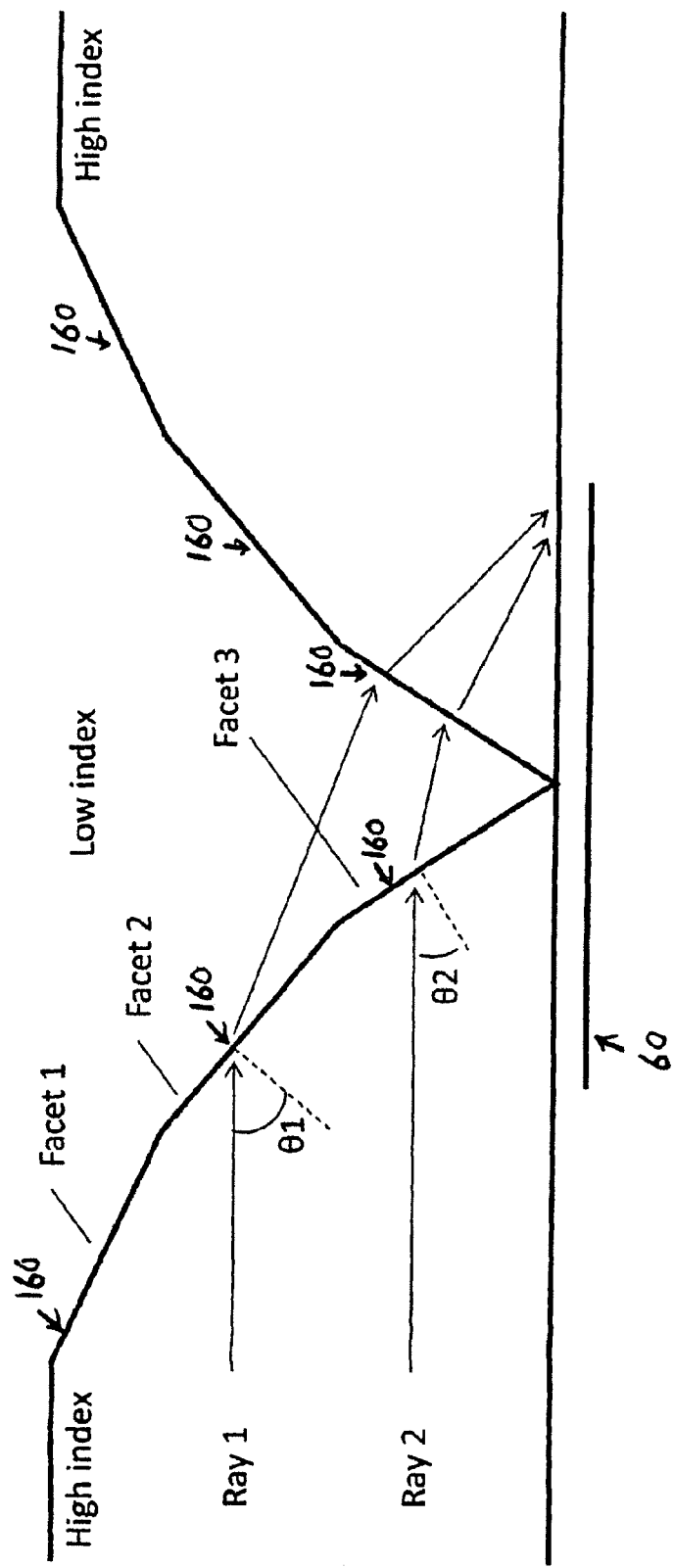
FIG. 11b illustrates another embodiment of redirecting optics showing TIR leaking.
Figure 11C:
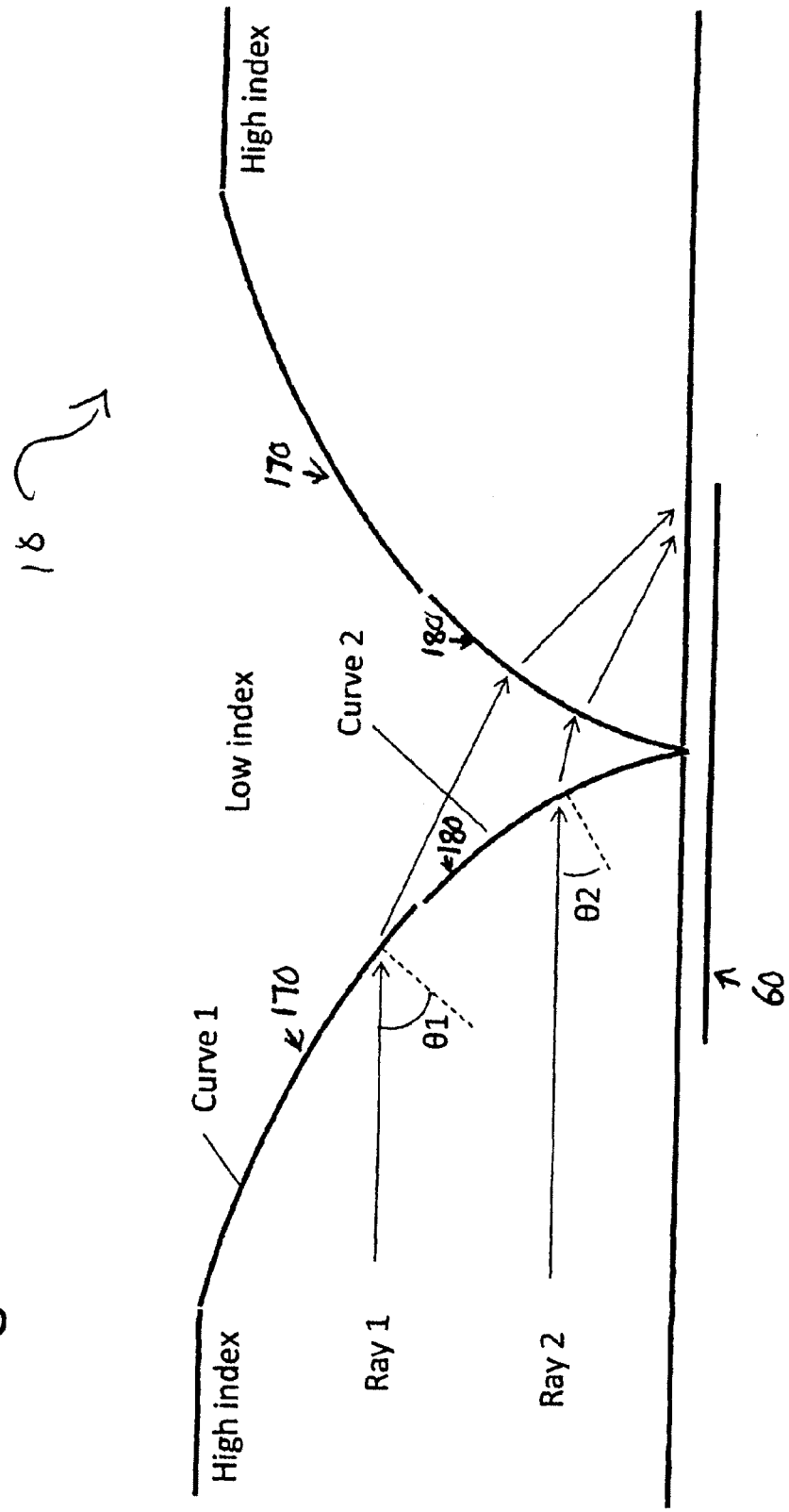
FIG. 11c illustrates another embodiment of redirecting optics showing TIR leaking.

In another embodiment a cascade of facets 160 are possible to take advantage of this effect, with the steeper ones of the facets 160 located closer to the bottom surface, as shown in FIG. 11b. Each facet 160 can be placed at the appropriate angle to maximize both concentration and efficiency given the range of angles of light rays incident upon it. Alternatively, a curved surface 170 that approximates the cascade of facets 160 may be applied to achieve the same, as shown in the embodiment of FIG. 11c. The redirecting optic 50 can also be comprised of multiple curves, such as parabolic section 170 and an arc 180, as shown in 11c.

8. Cladding on Base

Figure 12A:
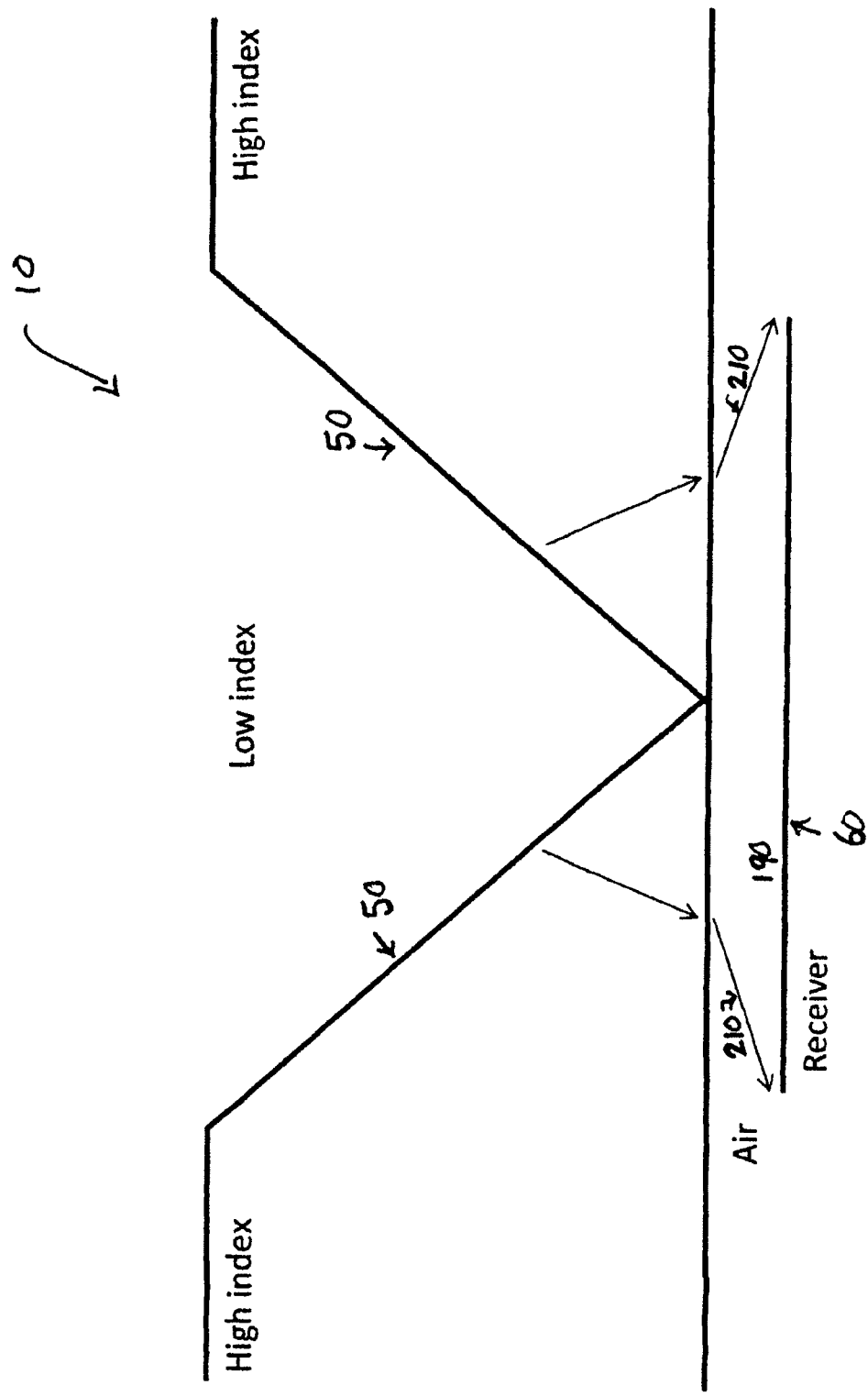
FIG. 12a illustrates an embodiment of redirecting optics with air between the redirecting optics and the receiver.

In another embodiment if air 190 is used between the base of the optics 50 and the top of the receiver 60, then light 210 exiting the redirecting optic 50 will refract to increase the cone angles, as shown in FIG. 12a.

Figure 12B:
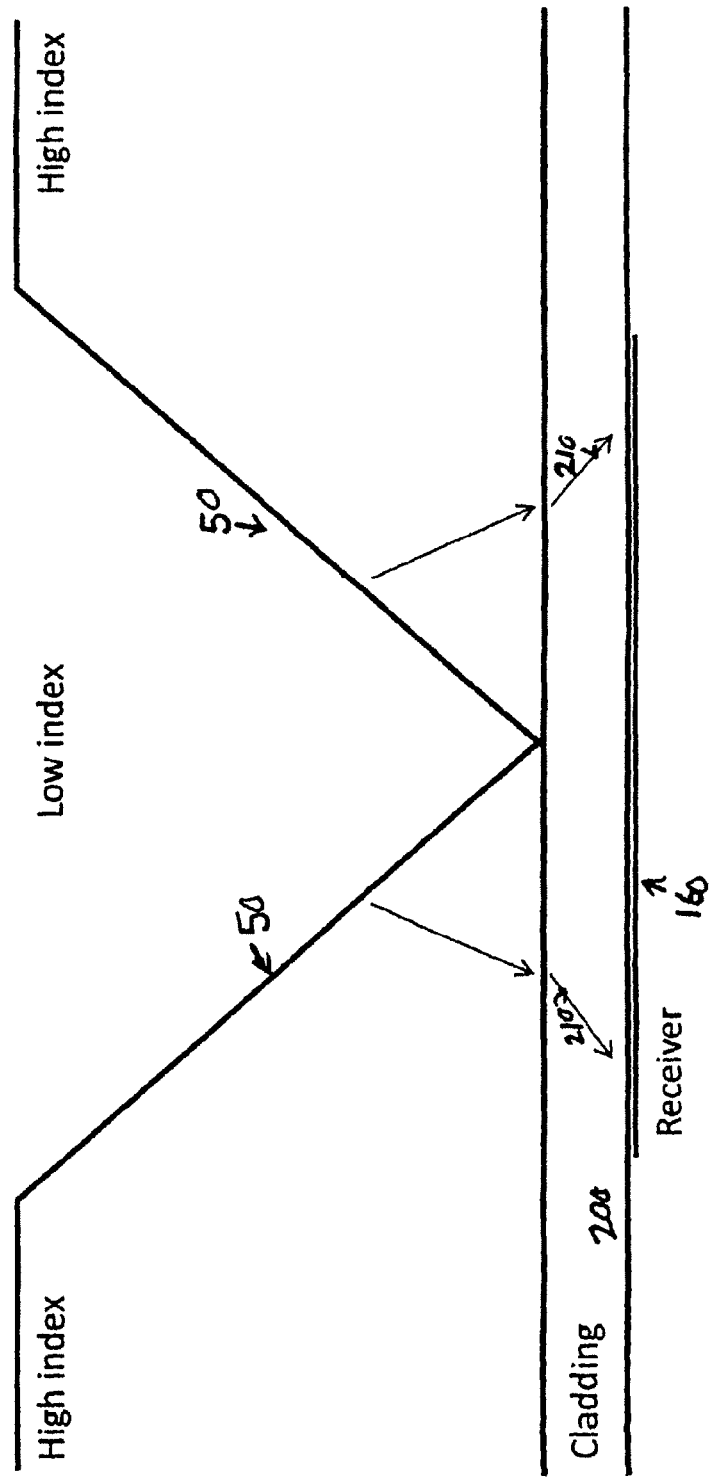
FIG. 12b illustrates an embodiment of redirecting optics with cladding material between the redirecting optics and the receiver.

A cladding material 200 may be applied to the base of the waveguide-redirecting optic construction, as shown in FIG. 12b. The cladding 200 is of a lower refractive index than the medium of the redirecting optic 50. This allows the cone of light 210 at the receiver 60 to be narrower as the refraction off the base of the optic system is mitigated (the rays 210 will refract by larger angles traveling from an optic to air which has the lowest possible refractive index, versus travelling from an optic to another material). Mitigating the cone angles out of the redirecting optic 50 can help preserve the level of concentration achieved by the overall optical system.

Cladding will also provide an efficiency advantage. Fresnel reflection occurs at interfaces of different refractive indices, with losses being larger for greater differences in index. Having air between the optic and the receiver 160 will result in the greatest Fresnel reflection losses.

Cladding can also provide structural and reliability advantages. It can encapsulate a sensitive material that needs environmental protection, like a photovoltaic cell. It can also decouple stresses between the optic and the receiver 160, for example as a result of differing rates of expansion under temperature increases.

9. Angled Light Guide

Figure 13A:
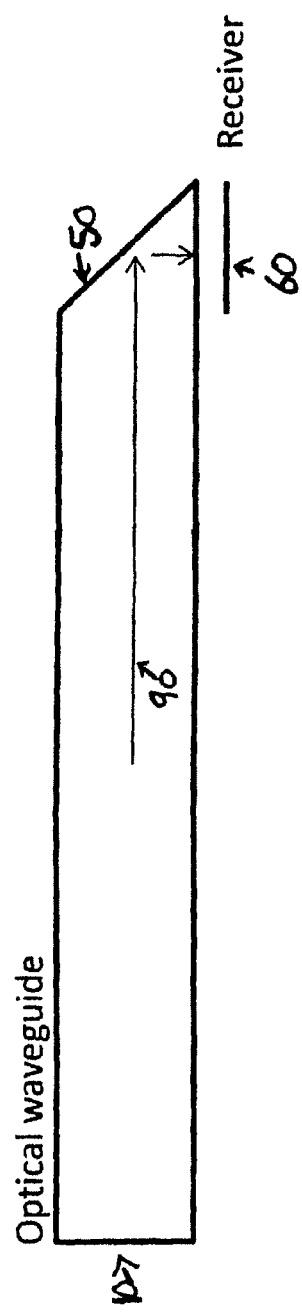
FIG. 13a illustrates an embodiment of the optical system.
Figure 13B:
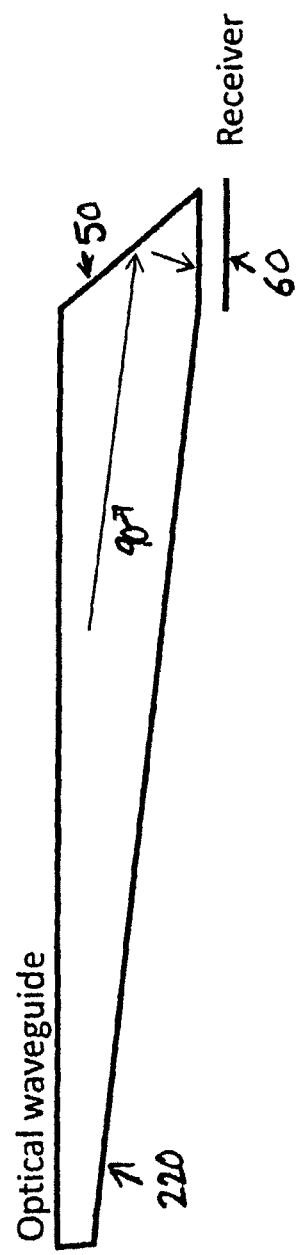
FIG. 13b illustrates an embodiment of the optical system with an angled waveguide.

In an alternate embodiment the direction of propagation of the light cone in the waveguide 10 need not be exactly perpendicular to the input light, as shown in FIG. 13a. In a variation the waveguide 220 may be constructed at an angle to the horizontal, as shown in FIG. 13b.

An angled form of the waveguide 10 is advantageous for the redirecting optic 50, since it allows for greater secondary concentration to remain with the TIR limit. The reason is because light has a smaller angle of required redirection. FIG. 13b shows this advantage—the light ray 90 can be reflected back in via total internal reflection over a larger angle than as shown in FIG. 13a.

Figure 13C:
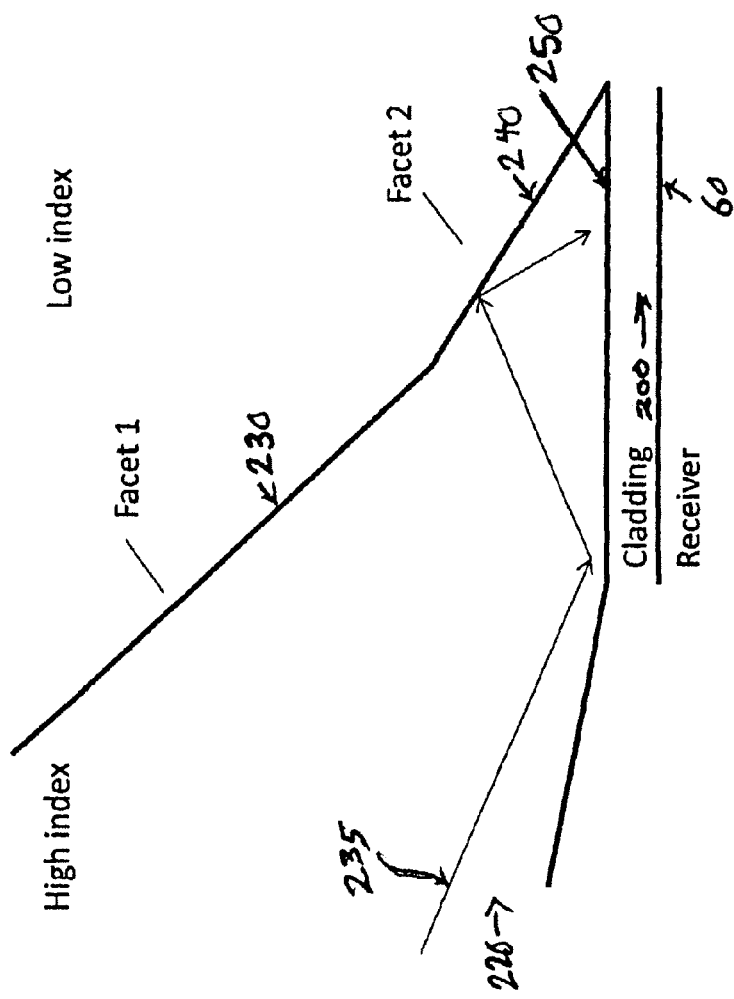
FIG. 13c illustrates an embodiment of redirecting optics with cladding material between the redirecting optics and the receiver.

FIG. 13c shows the change in angle of facets 230 required when an angled waveguide 220 combines with the cladding 200 on the base. In order to deal with extreme rays reflecting off the focal area 25, the final facet 24 ("Facet 2") needs to occur at a shallower angle than the previous facet 23 ("Facet 1"), otherwise light rays 235 reflected off the focal area will refract through the Facet 2 and escape upwards.

10. Redirecting Light Pipes

An alternative embodiment involves increasing the aspect ratio in order to win greater secondary concentration. FIG. 14a shows the use of a curved light pipe 260 to redirect the light 265. The aspect ratio of the optical waveguide 10-redirecting optic 260 is made significantly larger. FIG. 14b shows the same but achieving secondary concentration by tailoring the curved surfaces of the redirecting optics, or the pipe feature type of redirecting optics 260 to taper. FIG. 14c shows a similar approach but with flat facets for the redirecting optics 260 instead of curved sections.

The pipe feature 260 can in principle achieve greater secondary concentration than the redirecting optics discussed thus far, because it preserves the level of concentration given by the optical waveguide 10, orients the light cone to face the receiver 60 directly, and then can achieve the maximal level of secondary concentration. Previous redirecting optics faced total internal reflection constraints that prevented achieving the maximum allowable levels of secondary concentration.

Figure 15A:
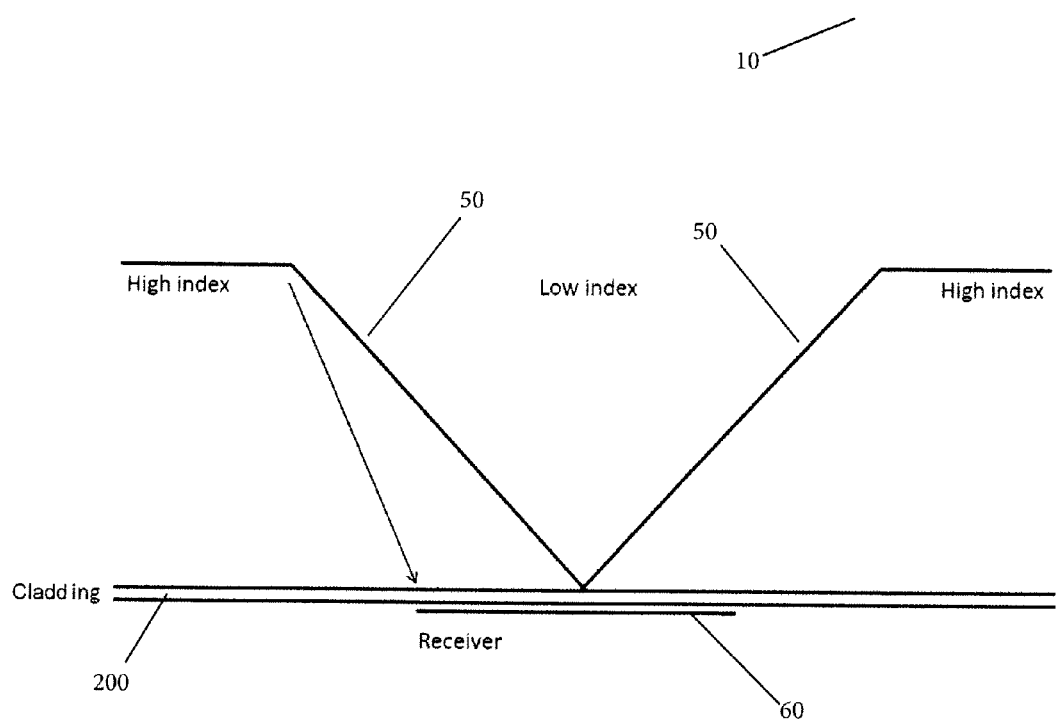
FIG. 15a illustrates an embodiment of redirecting optics with cladding material between the redirecting optics and the receiver.
Figure 15B:
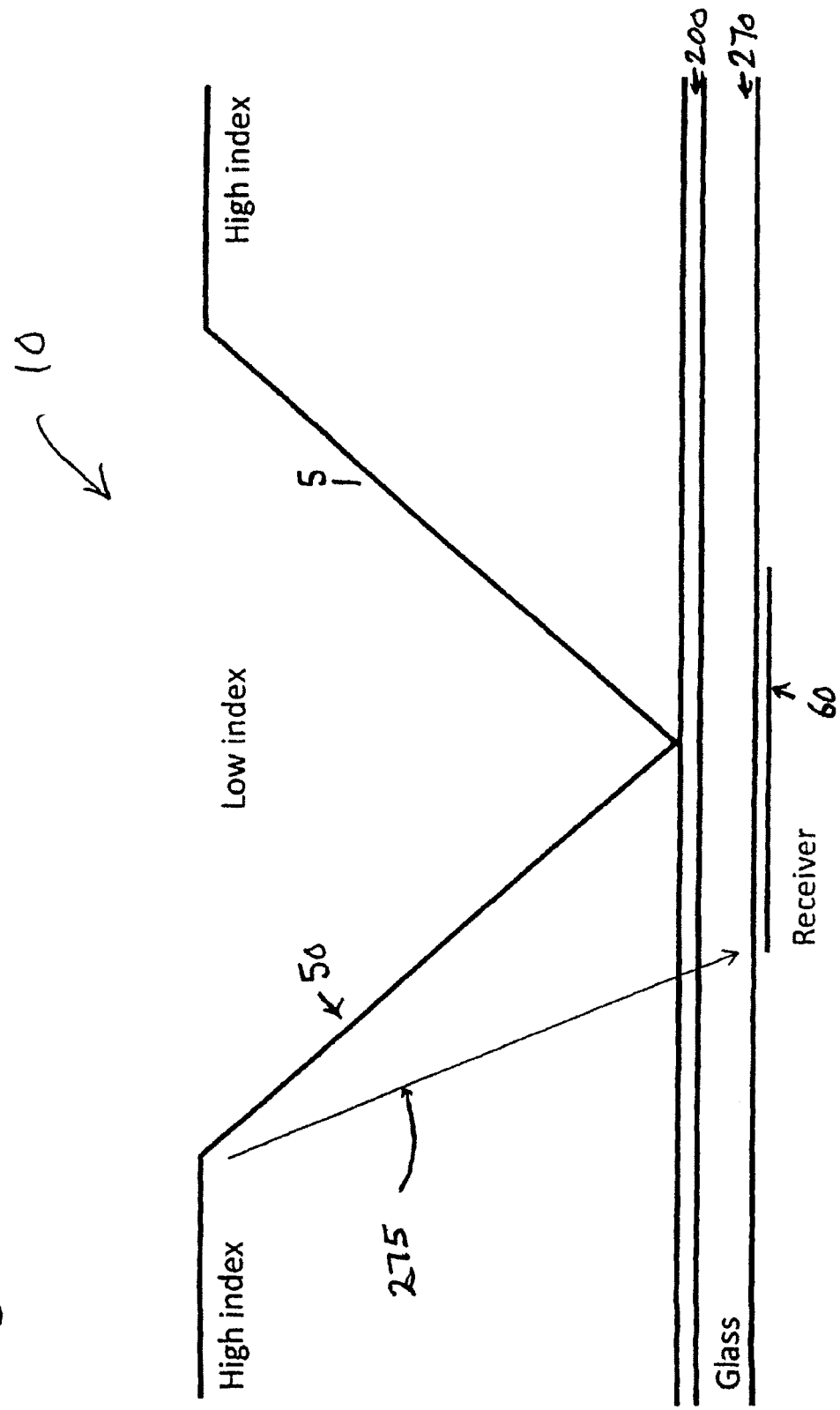
FIG. 15b illustrates an embodiment of redirecting optics with cladding material and glass between the redirecting optics and the receiver.

However, previous redirecting optics 260 do retain the compactness of the optical waveguide. Hence the following tradeoffs are seen:

TIR non-pipe approaches that achieve highest compactness and highest efficiency but not highest concentration Reflector non-pipe approaches that achieve highest compactness and highest concentration but not highest efficiency TIR pipe approaches that achieve highest concentration and highest efficiency but not highest compactness 11. Base Glass Another embodiment also increases the aspect ratio somewhat in order to win greater concentration. FIG. 15a shows a design already discussed—the redirecting optics 50 with the cladding layer 200. FIG. 15b shows how a sheet of optical material like glass 270 can be placed at the base of the waveguide-redirecting optic construction. The additional height enables greater secondary concentration as the light 275 has a greater distance to travel, and the angles of the edge rays are such that greater travel shrinks the final focal area.

The base glass 270 can also act as a mechanical and environmental barrier, protecting the receiver 60 (e.g., solar cell) from dirt and moisture that may enter the voids in the optical components, and from mechanical stresses from thermal and other expansion and contraction.

12. Supporting Optics for Central Redirection

Since the overall waveguide-redirecting optic construction is designed to efficiently collect light 20 from the top surface, the light 20 falling on the central region of the construction (above the redirecting optic) must also be collected for optimal efficiency.

Figure 16A:
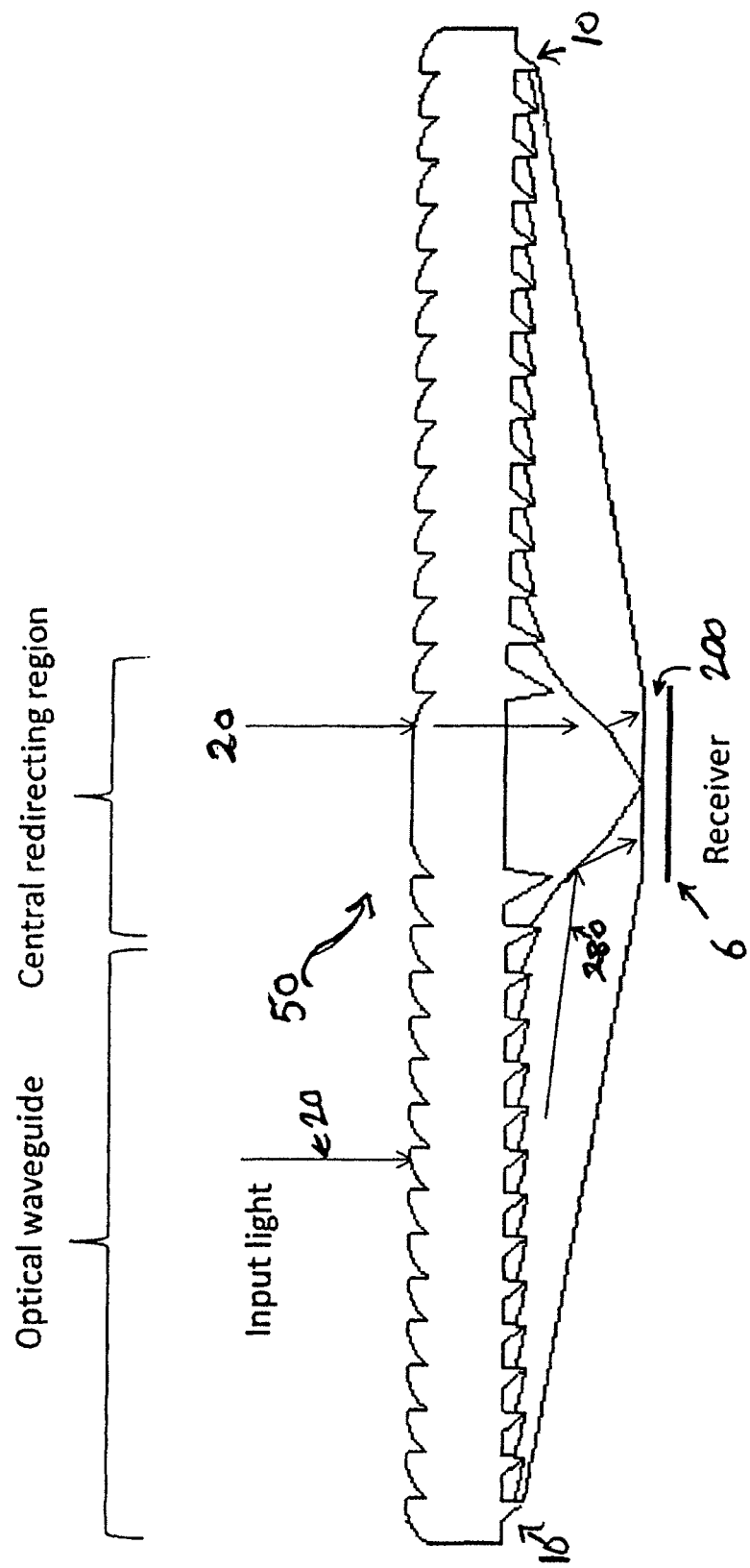

FIG. 16a shows an embodiment with the complete waveguide 10-redirecting optic 50 combination, including supporting optics for the central redirection. It is designed so that input light 20 falling across the entire front surface of the optical waveguide 10 is delivered to the receiver 60.

FIG. 16b shows a close-up of the central redirecting region. A light ray 280 from the optical waveguide 10 is depicted, with a path to the receiver 60 as has been discussed previously.

The question is how light rays 20 from the central redirecting 50 region can make their way to the receiver 60. Three approaches are possible, preferably in combination. First, the design of sections of the optical waveguide 10 may be modified to accommodate the different angled surfaces on the redirecting optic 50. In FIG. 16c, the system through which the light ray 280 travels has larger lens 290 and facet 300 features to accommodate the tapering of the redirecting optic surface 310 towards the receiver 60. The light ray 280 therefore travels through a different pathway than the rays 20 from other embodiments described before in the optical waveguide 10 system.

Figure 16D:
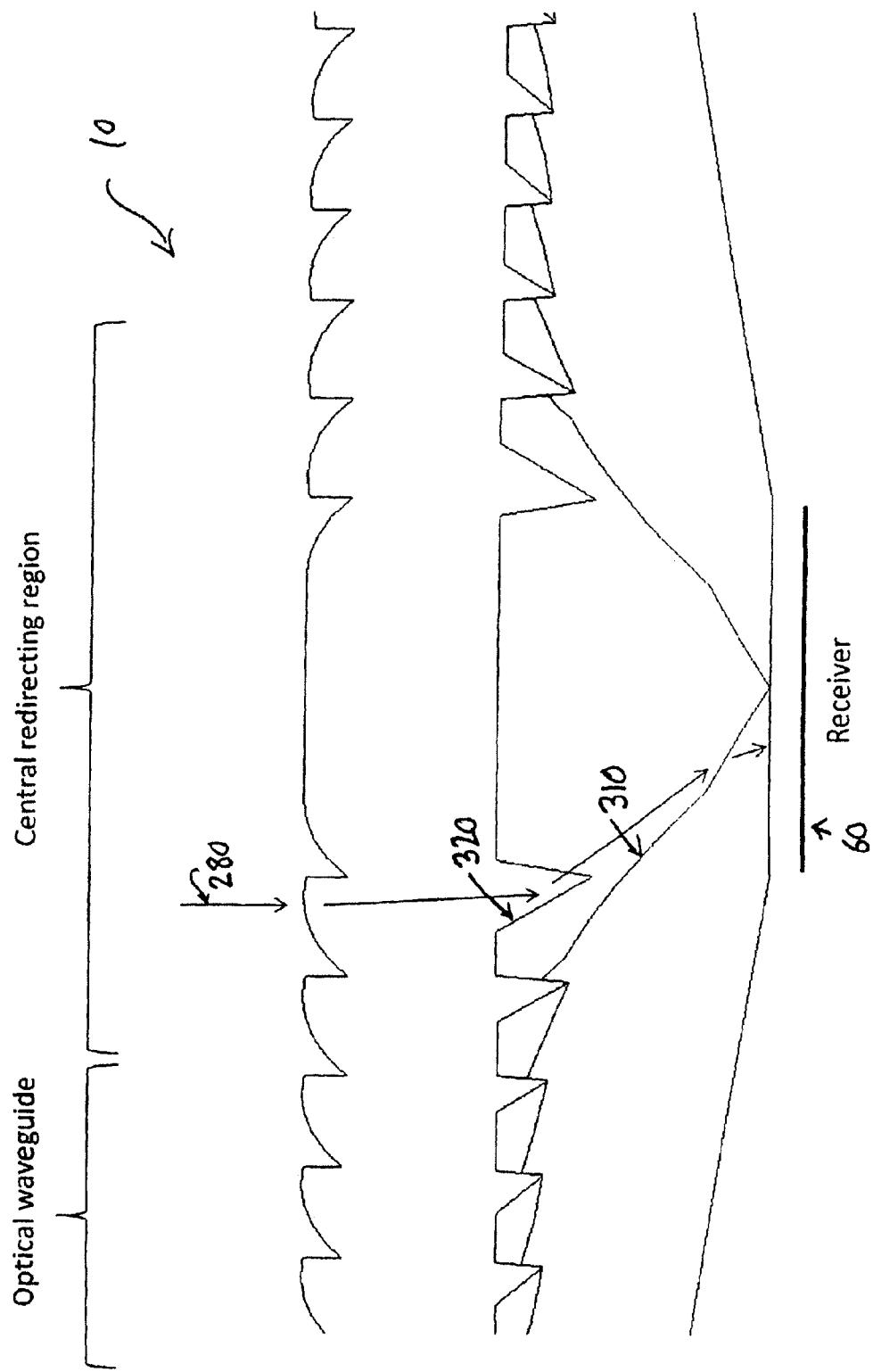

Second, features can be placed in the top element to direct the light 280 to an appropriate place on the redirecting optic 50 such that it is delivered to the receiver 60. In FIG. 16d, the tooth feature 320 on the base of the top element redirects the light ray 280 such that it intersects with the redirecting optic surface 310 in the region directly above the receiver 60. Without that tooth feature 320, the light ray 280 would not hit the receiver 60, limiting efficiency, or the receiver 60 would have to be wider to accommodate the ray 280, limiting concentration.

Third, rays sufficiently near the center of the system of optical components are allowed to pass through with no change in direction. They undergo some refraction upon hitting the redirecting surface optic 310, but they are sufficiently near the center of the system so as to ensure they end up on the receiver 60.

Options two and three above require that the entire redirecting optic 310 be constructed with no reflector—i.e., pure TIR is employed. A reflective coating on the redirecting optic 310 would block incoming rays from the central redirecting region, limiting efficiency.

FIGS. 16a-c combine many elements discussed in the previous sections in a preferred embodiment:

From Section 1 the redirecting optic 310 is made as one part with the optical waveguide 10, for simplified manufacturing.

From Section 2 the optical waveguide 10-redirecting optic 50 is mirrored about a central axis, increasing collection area and compactness of the overall device.

From Section 3 the optical waveguide 10 achieves secondary concentration such that Cfinal>C1, reducing the receiver 60 area and thereby receiver cost.

From Section 4 the redirecting optic 310 employs total internal reflection to maximize efficiency From Section 6 the redirecting optic 310 employs a parabolic curve to increase secondary concentration, and then truncates the curve with a flat facet attached to it as the TIR limit is reached. (The parabolic curve may be approximated by several flat facets to achieve a comparable result.)

From Section 7 the redirecting optic 310 allows "TIR leaking"—some rays are allowed to breach the critical angle and refract over to the mirror image surface, where they are nevertheless collected by the receiver 60. This allows the redirecting surface 310 to have steeper angles enabling further secondary concentration.

From Section 8 cladding 200 is used between the redirecting optic and the receiver, to enhance concentration, efficiency, structural support, and reliability From Section 9 the optical waveguide 10 is an angled waveguide—i.e., the waveguide 10 is not perfectly perpendicular to the input light 20. This allows the redirecting optic 310 to have steeper angles which increases secondary concentration achievable.

From Section 12 supporting optics 290, 300, 320 are constructed in the optical waveguide 10 in the central redirecting region above the redirecting optic 310. These supporting optics ensure that light incident on the central region is delivered to the receiver 60 through the redirecting optic 310, maximizing efficiency and concentration.

As has been illustrated above, the redirecting optic 50 can be comprised of any combination of a parabolic surface, an elliptical surface, a hyperbolic surface, an arc, a flat reflective surface, a tailored shape reflective surface, a total internal reflecting surface, a component parabolic concentrator optic, a light pipe, and a refractive component.

The previous sections described ways to design various embodiments of the redirecting optics 50. The following describe two alternative implementations for the redirecting optics 50. All of the descriptions in the previous elements apply to the following two implementations.

Linearly Symmetrical Optics Versus Axially Symmetrical Optics

Figure 17A:
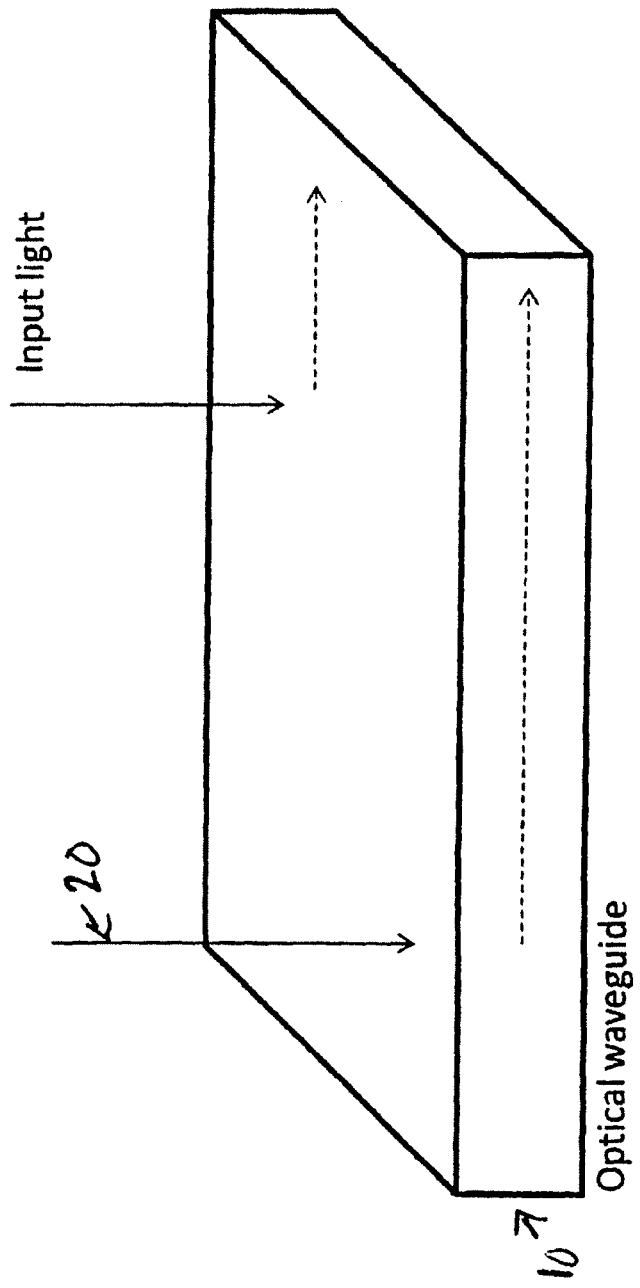
FIG. 17a illustrates a linearly symmetric optical system.
Figure 17B:
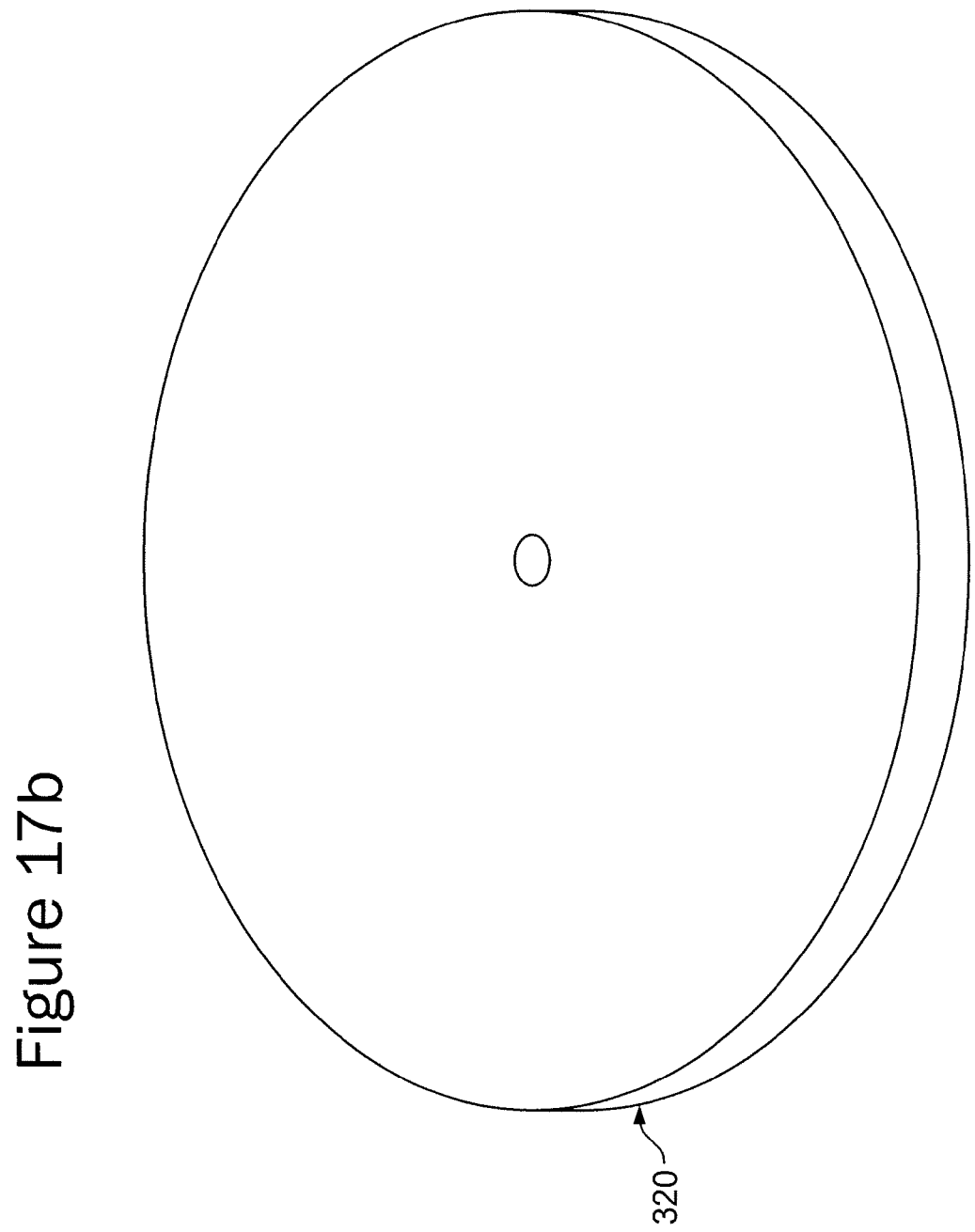
FIG. 17b illustrates an axially symmetric optical system.

Since the design lies in the cross-section, the optical components may be rendered in a linear extrusion as shown in FIG. 17a, or a rotational extrusion as shown in FIG. 17b. All the elements described in this application are applicable to either extrusion.

Figure 17C:
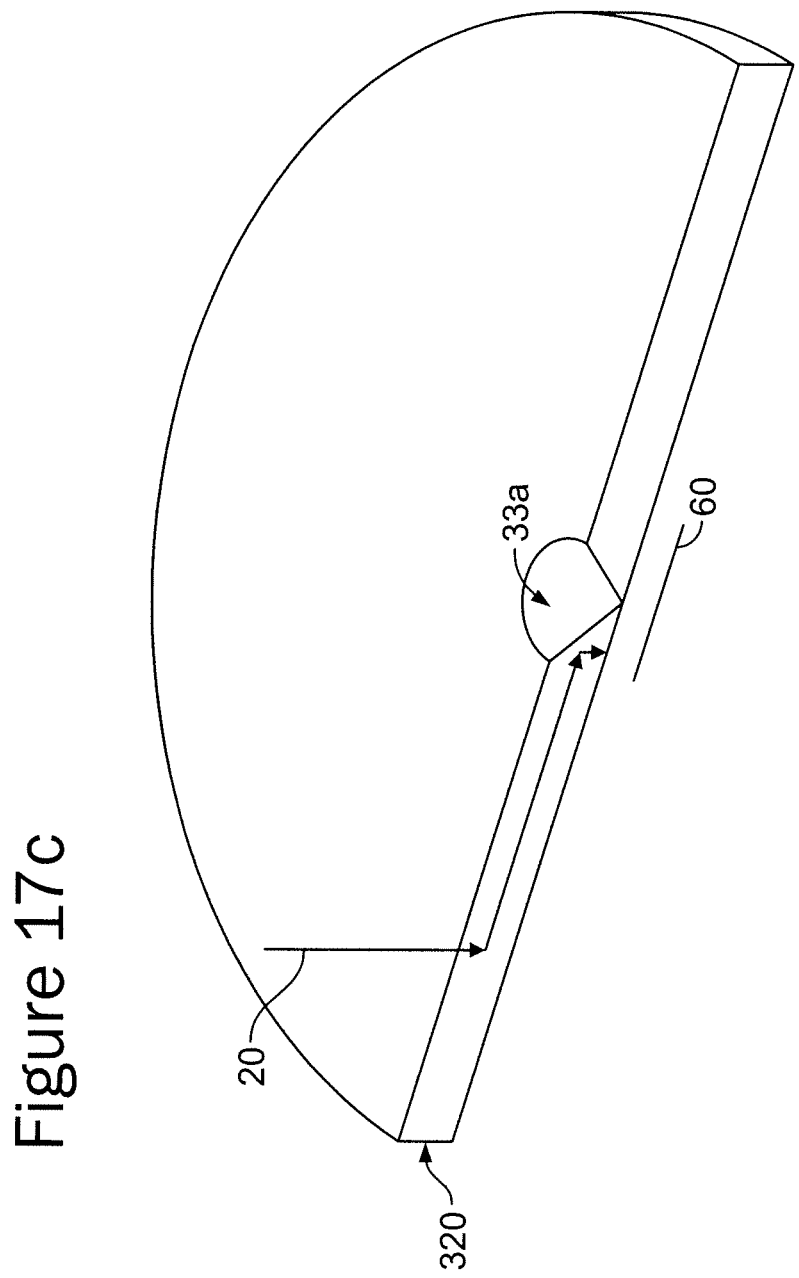
FIG. 17c-f illustrates various embodiments of axially symmetric optical systems and associated redirecting optics.
Figure 17D:
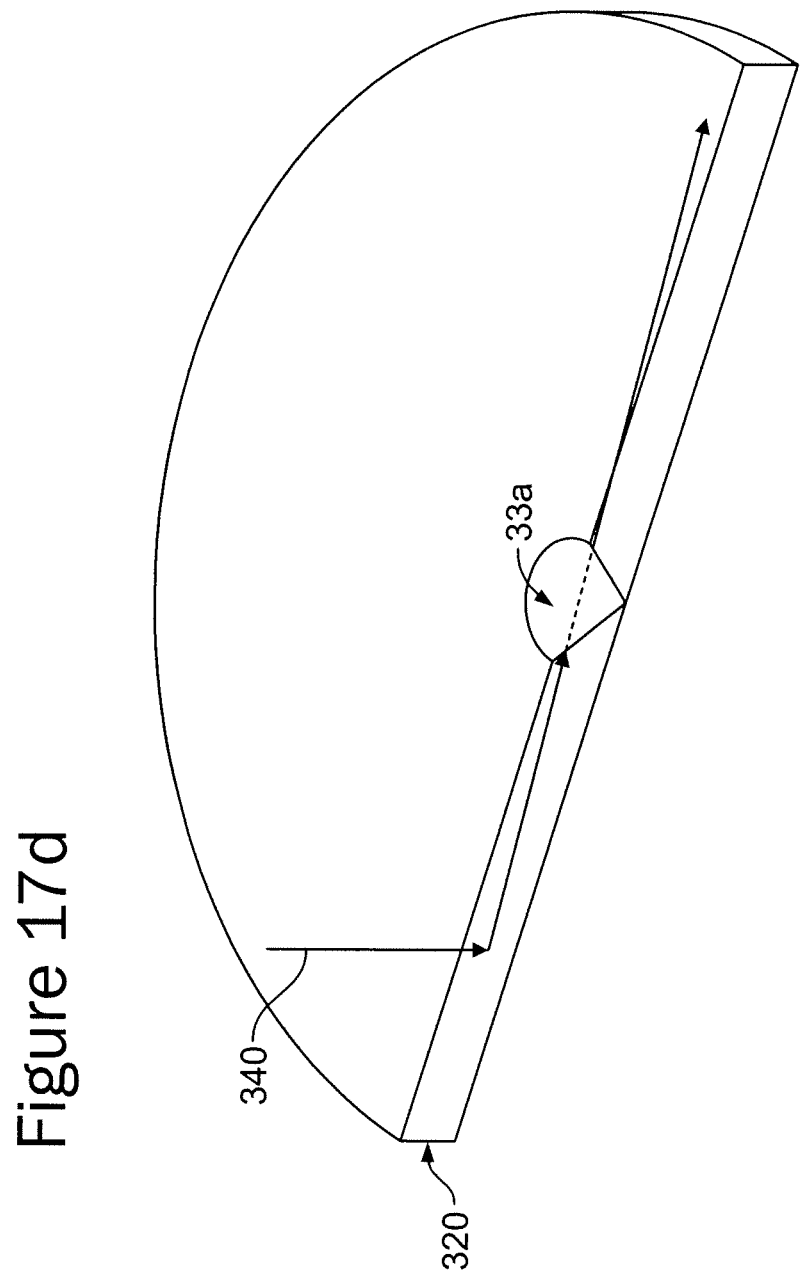

However, axially symmetric optics in rotational extrusion face an additional challenge. FIG. 17c shows a familiar case—a light ray 20 from the optical waveguide 320 is redirected downwards towards a central receiver 60. However, in the rotational extrusion, the light ray 20 would have to be in perfect alignment with the radius of the disc in order to strike the redirecting optic 330 for redirection as designed (note that the tip of the redirecting optic 330 comes down to a point in the rotational extrusion). In FIG. 17d, a light ray 340 that is slightly off center misses the redirecting optic 330 and does not arrive at the receiver 60.

Figure 17E:
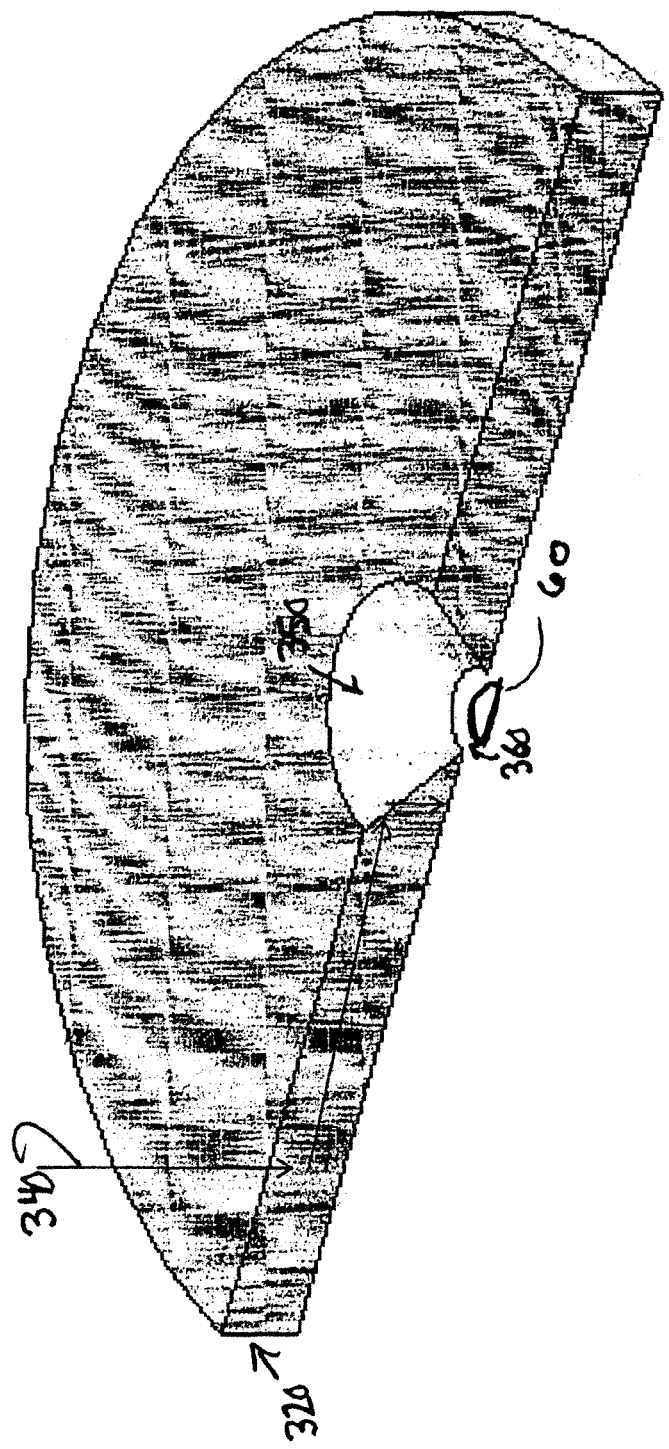

In FIG. 17e, this is ameliorated by shifting the axis of rotation away from the tip of the redirecting optic 330. Thus the light ray 340 faces not a point but a wall 350. The distance of the axis of rotation from the tip of the optic 360 can be tuned so that substantially all of the waveguide light 20 is captured, maximizing efficiency. The disadvantage is weaker secondary concentration as compared to the linear extrusion of the same cross-sectional design.

Figure 17F:
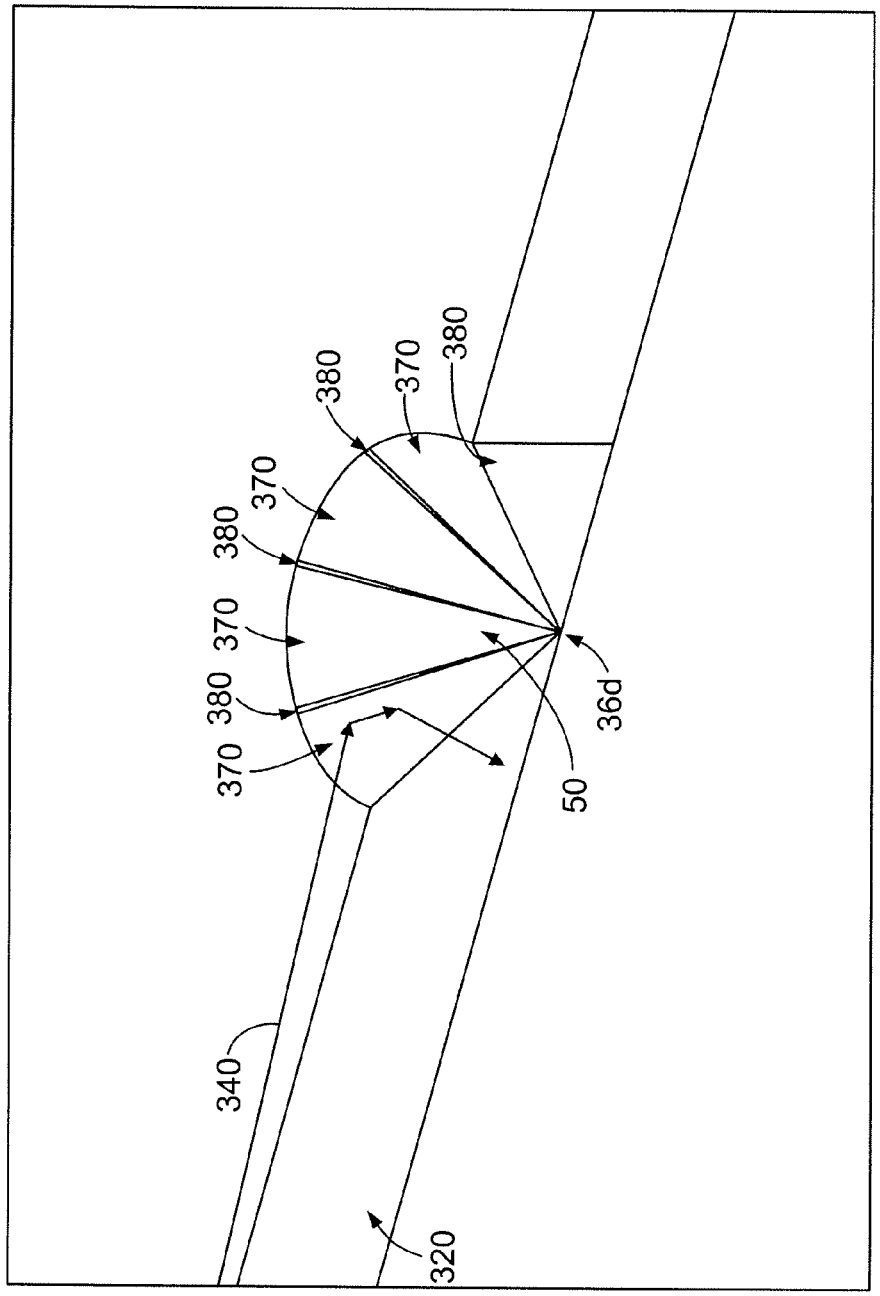

FIG. 17f shows an embodiment in another approach to solving the problem. The redirecting optic tip 360 is treated as the axis of rotation. However, the redirecting region 50 has vertical slits 380 sliced into it at periodic intervals about the axis. These slits 380 may be filled with air or a low index cladding material, or the walls of the redirecting region 50 may be coated with a reflector. A ray of light 340 that is off center will hit one of the walls 380 and be reflected back in towards the center. After one or several reflections of the "guide wall" the ray 340 will finally interact with the redirecting surface of the redirecting optic 370, and be redirected downwards to the receiver 60. This approach can preserve the secondary concentration achievable in a linear extrusion of the same cross-section. If no reflective coating is used, i.e., total internal reflection is the sole mechanism, then this approach maximizes efficiency as well.

Optical Path in Reverse for Light Diffusion or Illumination

In yet another embodiment the optics described in this application are so far for light collection and concentration. However, the optical system in reverse is an effective diffuser of light.

Figure 18:
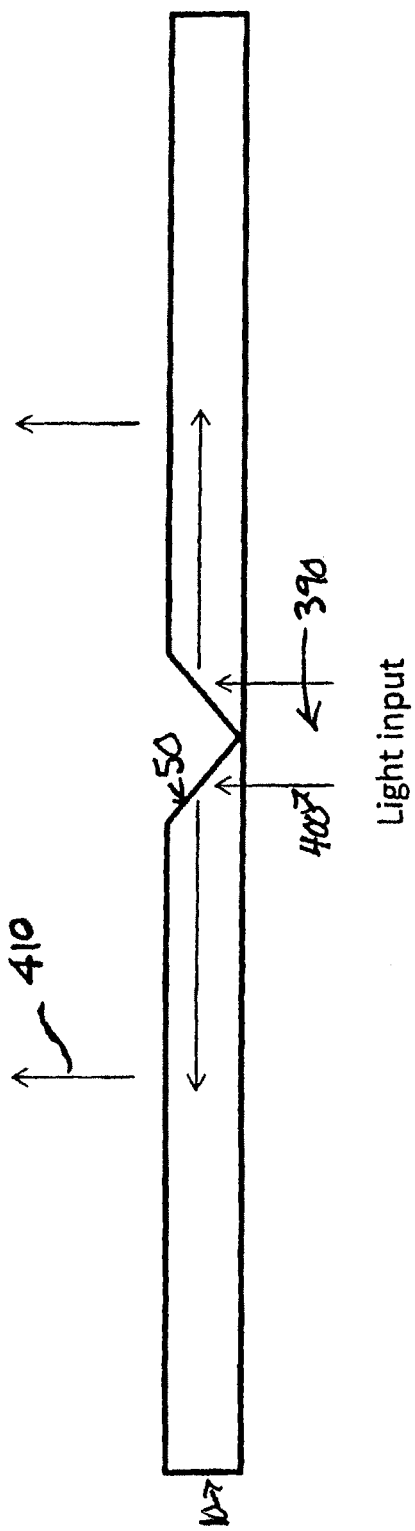
FIG. 18 illustrates an embodiment of the optical system constructed for illumination applications.

In FIG. 18, light 400 enters the device from a light source 290 where the receiver 60 has so far been—the central region at the base. The light 400 is redirected into the optical waveguide 10 via the redirecting optics 50, and the optical waveguide 10 takes the light travelling substantially horizontal and diffuses it to output rays 410 that are substantially normal to the surface of the waveguide 10. The top surface of the waveguide 10 may be tuned with lenses or other optical elements to emit light at any range of angles. Thus the device is a highly compact and efficient light diffuser. Applications include but are not limited to LED optics, luminaires, spotlights, and automotive headlights and taillights.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described to explain the principles of the present invention and its practical application to enable one skilled in the art to utilize the present invention in various embodiments and with various modifications as are suited to the particular use contemplated.

The invention claimed is:

1. An optical illumination system, comprising:
   a light source for providing input light to an optical waveguide
   an optical waveguide for diffusing the input light for illumination, and
   a redirecting optic for redirecting the light from the light source towards the optical waveguide;
   a concentrating element for collecting and repositioning light;
   a central redirecting region comprising central portions of the concentrating element and waveguide and the redirecting optic, at least two central redirecting region teeth extending from the concentrating element in the central redirecting region positioned above and optically coupled to the redirecting optic and separate from the waveguide.

2. The optical illumination system as defined in claim 1 wherein the redirecting optic is selected from the group consisting of a parabolic surface, an elliptical surface, a hyperbolic surface, an arc, a flat reflective surface, a tailored shape reflective surface, a total internal reflecting surface, a compound parabolic concentrator optic, a light pipe, and a refractive component.

3. The optical illumination system as defined in claim 1 wherein the optical waveguide and redirecting optic are mirrored about a central axis to form at least two systems which combine to form one contiguous system, thereby doubling light collection while maintaining height of the optical waveguide.

4. The optical illumination system as defined in claim 1 wherein the optical illumination system is axially symmetric about an axis of rotation.

5. The optical illumination system as defined in claim 4 wherein the axis of rotation is spaced apart from the edge of the redirecting optic, thereby ensuring off-axis light from the optical waveguide is transferred from the light source.

6. The optical illumination system as defined in claim 1 wherein the redirecting optic includes a physically separated portion from the waveguide and the separated portion includes a single vertical slit of air, low index material, or reflective material adjacent the waveguide, thereby ensuring off-axis light from the optical waveguide is reflected off a vertical slit for output.

7. The optical illumination system as defined in claim 1 wherein the light source is disposed directly adjacent the optical waveguide for outputting the light directly from the optical waveguide without an intervening solid optical component.

8. The optical illumination system as defined in claim 1 wherein the redirecting optic is comprised of the upper surface which is integrally part of the optical waveguide.

9. The optical illumination system as defined in claim 1, wherein the concentrating element has plurality of teeth.

10. The optical illumination system as defined in claim 1, wherein the redirecting optic is mirrored about a central axis.

11. The optical illumination system as defined in claim 1, wherein the redirecting optic has an angled surface that allows TIR leaking.

12. An optical system, comprising:
    a concentrating element for collecting and concentrating light and optical communication with an optical waveguide;
    the optical waveguide positioned to receive light from the concentrating element and concentrate the light to a receiver, and
    a redirecting optic for redirecting the light from the optical waveguide towards the receiver, the redirecting optic comprised of the upper surface which is integrally part of the optical waveguide;
    a central redirecting region comprising central portions of the concentrating element and waveguide and the redirecting optic, at least two central redirecting region teeth extending from the concentrating element in the central redirecting region positioned above and optically coupled to the redirecting optic and separate from the waveguide.

13. The optical system as defined in claim 12 wherein the redirecting optic is selected from the group consisting of a parabolic surface, an elliptical surface, a hyperbolic surface, an arc, a flat reflective surface, a tailored shape reflective surface, a total internal reflecting surface, a compound parabolic concentrator optic, a light pipe, and a refractive component.

14. The optical system as defined in claim 12 wherein the optical waveguide and redirecting optic are mirrored about a central axis to form at least two systems, such that the receivers from the at least two systems combine to form one contiguous receiver.

15. The optical system as defined in claim 14 wherein the redirecting optic allows some of the light from the optical waveguide to refract towards the mirror image redirecting optic, transmitting through the mirror image redirecting optic for collection by the receiver.

16. The optical system as defined in claim 12 wherein the optical waveguide contains optical elements that direct the input light in the region above the receiver towards an outer face of the redirecting optic for transmission through the redirecting optic towards the receiver.

17. The optical system as defined in claim 12 wherein the optical concentration system is axially symmetric about an axis of rotation and wherein the axis of rotation is spaced apart from the edge of the redirecting optic, thereby ensuring off-axis light from the optical waveguide is transferred to the receiver.

18. The optical concentration system as defined in claim 12 wherein the redirecting optic contains vertical slits of air, low refractive index material, or reflective material, thereby ensuring off-axis light from the optical waveguide is reflected off a vertical slit towards the receiver.

* * * * *